(12) United States Patent
Shen et al.

(10) Patent No.: US 11,785,769 B2
(45) Date of Patent: Oct. 10, 2023

(54) MANUFACTURING METHOD OF SEMICONDUCTOR DEVICE INCLUDING FLOATING GATE AND CONTROL GATE

(71) Applicant: Winbond Electronics Corp., Taichung (TW)

(72) Inventors: Hsin-Huang Shen, Taichung (TW); Yu-Shu Cheng, Taichung (TW); Yao-Ting Tsai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/857,034

(22) Filed: Jul. 3, 2022

(65) Prior Publication Data
US 2022/0336481 A1 Oct. 20, 2022

Related U.S. Application Data

(62) Division of application No. 16/713,020, filed on Dec. 13, 2019, now Pat. No. 11,424,254.

(51) Int. Cl.
*H01L 29/66* (2006.01)
*H10B 41/30* (2023.01)
*H01L 29/06* (2006.01)
*H01L 29/423* (2006.01)
*H01L 29/788* (2006.01)
*H01L 21/762* (2006.01)
*H01L 21/28* (2006.01)
*H01L 29/78* (2006.01)
(Continued)

(52) U.S. Cl.
CPC ....... *H10B 41/30* (2023.02); *H01L 21/76224* (2013.01); *H01L 29/0653* (2013.01); *H01L 29/40114* (2019.08); *H01L 29/42324* (2013.01); *H01L 29/66545* (2013.01); *H01L 29/66598* (2013.01); *H01L 29/66825* (2013.01); *H01L 29/7833* (2013.01); *H01L 29/7883* (2013.01); *H10B 41/42* (2023.02); *H01L 21/3213* (2013.01)

(58) Field of Classification Search
CPC ........ H10B 41/42; H10B 41/43; H10B 41/44; H10B 41/47; H10B 41/48; H01L 29/40114; H01L 29/42324; H01L 29/66825; H01L 29/7883; H01L 29/66545
See application file for complete search history.

(56) References Cited

U.S. PATENT DOCUMENTS 8,901,632 B1 * 12/2014 Perera ............... H01L 29/66484
438/266
9,035,419 B2 * 5/2015 Oh ........................ H01L 21/764
257/E21.573
9,899,397 B1 * 2/2018 Leobandung ....... H01L 29/7881
(Continued)

*Primary Examiner* — Marcos D. Pizarro
*Assistant Examiner* — William Henry Anderson
(74) *Attorney, Agent, or Firm* — JCIPRNET

(57) ABSTRACT

A manufacturing method of semiconductor device is provided. In the manufacturing method, a tunneling dielectric layer, floating gates on the tunneling dielectric layer, an ONO layer on the floating gates, and control gates on the ONO layer are formed. During the formation of the floating gates and the control gates, reactive-ion etching (R.I.E.) is not used at all, and thus damage to the floating and control gates from high-density plasma is prevented, such as charge trap in the floating gates may be significantly reduced to improve the reliability of data storage.

15 Claims, 30 Drawing Sheets

(1)

(2) (3)

(51) Int. Cl.
  *H10B 41/42*  (2023.01)
  *H01L 21/3213*  (2006.01)

(56) References Cited

U.S. PATENT DOCUMENTS

| | | | |
|---|---|---|---|
| 2009/0001425 A1* | 1/2009 | Ariyoshi | H10B 41/40 |
| | | | 257/E27.103 |
| 2017/0301683 A1* | 10/2017 | Chen | H01L 29/42328 |
| 2019/0319034 A1* | 10/2019 | Lee | H10B 41/10 |
| 2019/0348426 A1* | 11/2019 | Cho | H01L 29/4933 |
| 2021/0151447 A1* | 5/2021 | Chuang | H01L 29/66969 |

\* cited by examiner

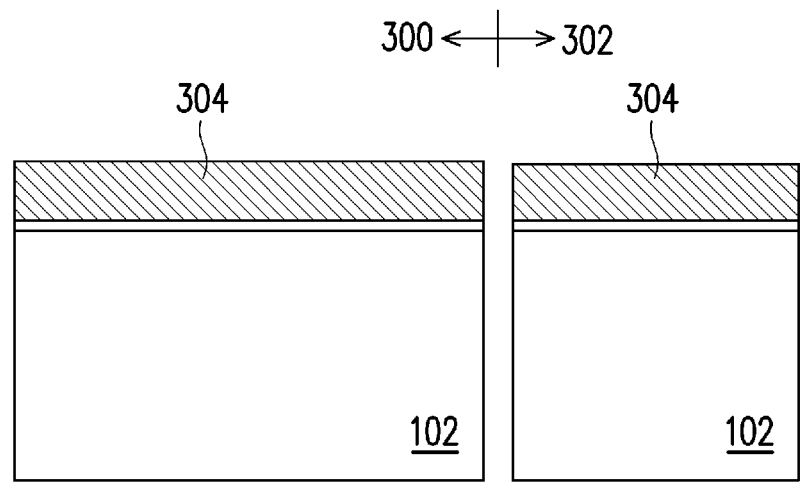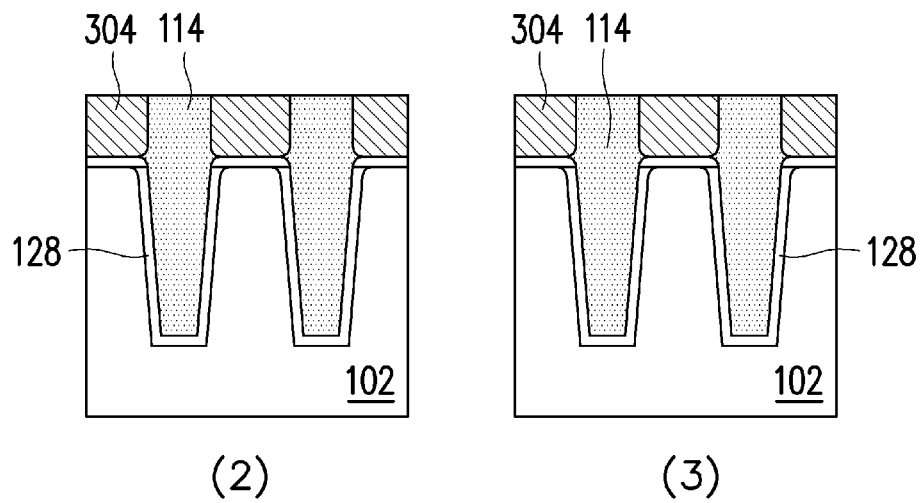
FIG. 3C

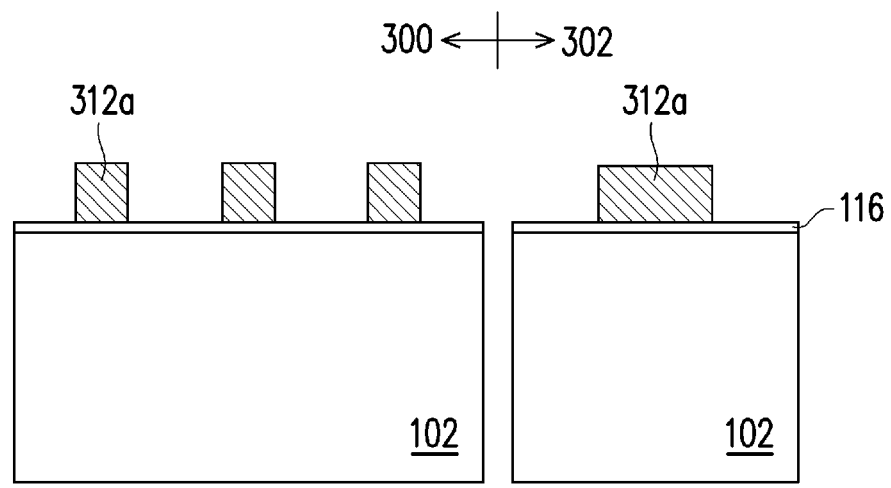
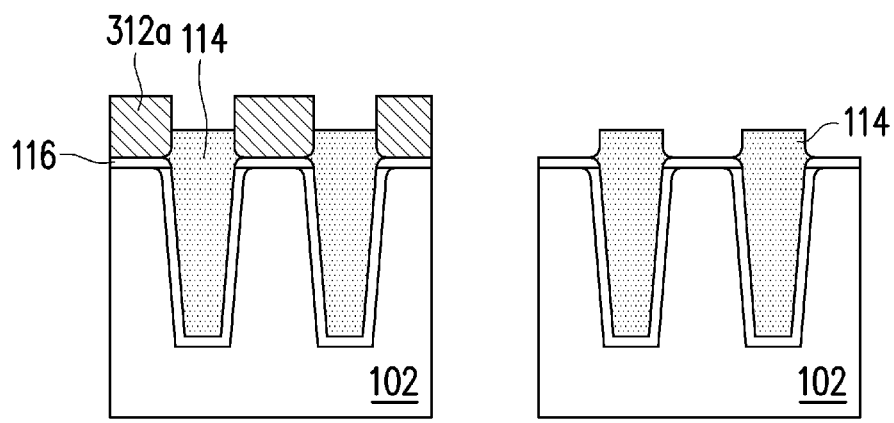
FIG. 3E

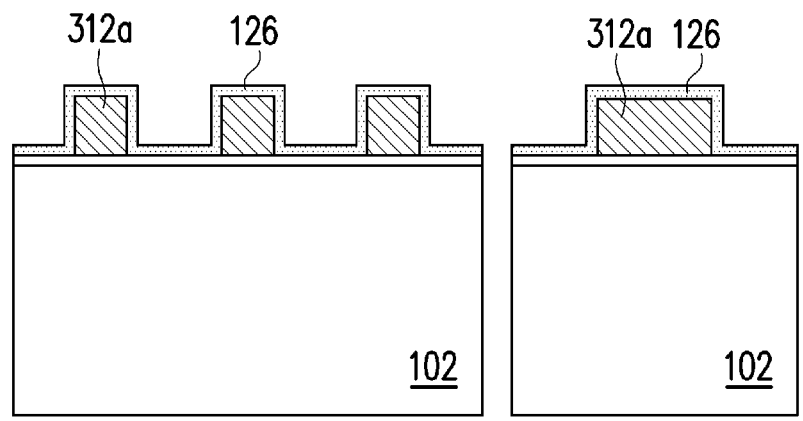
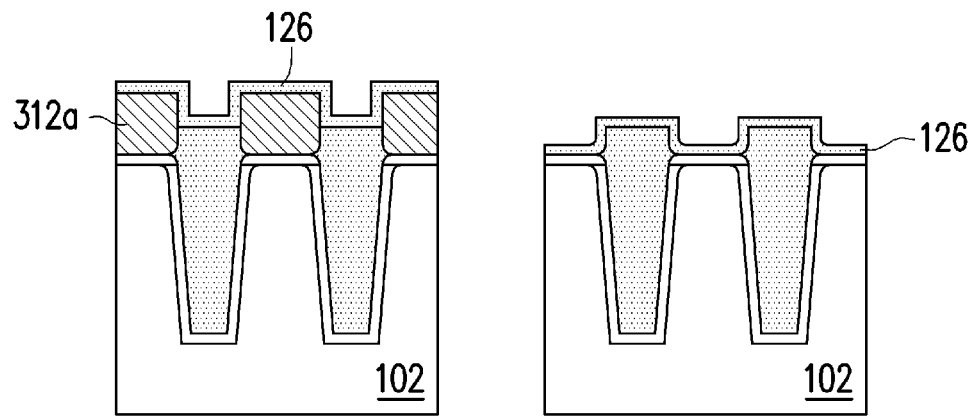
FIG. 3G

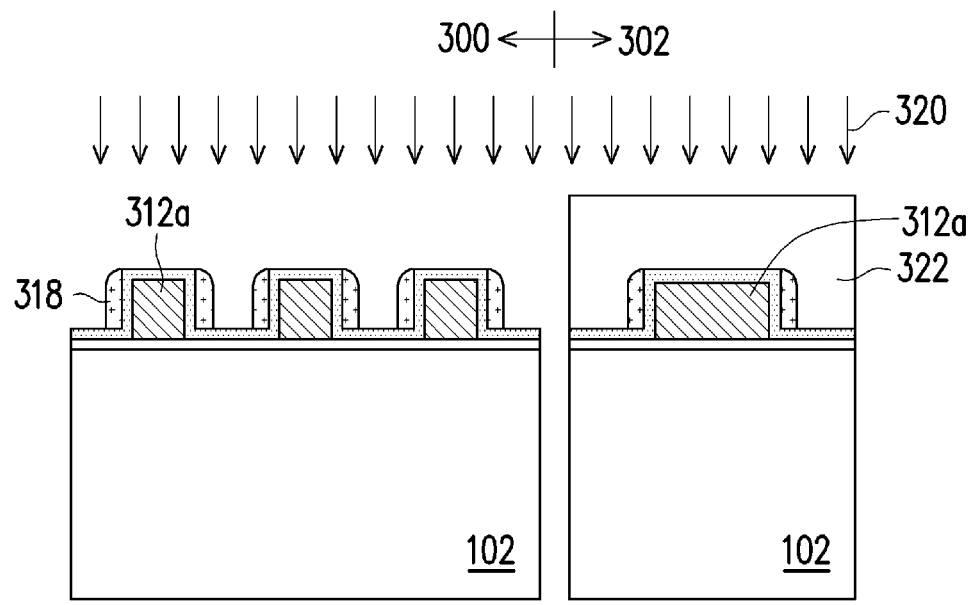
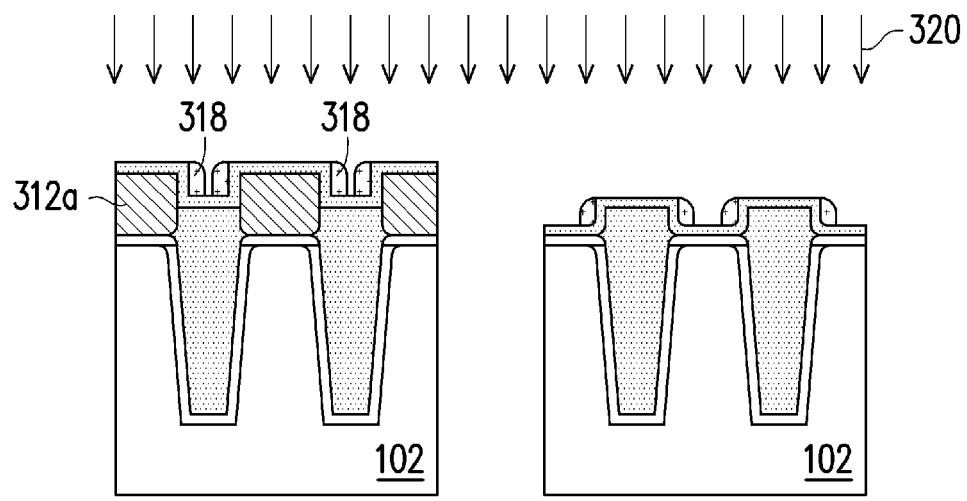
FIG. 3H

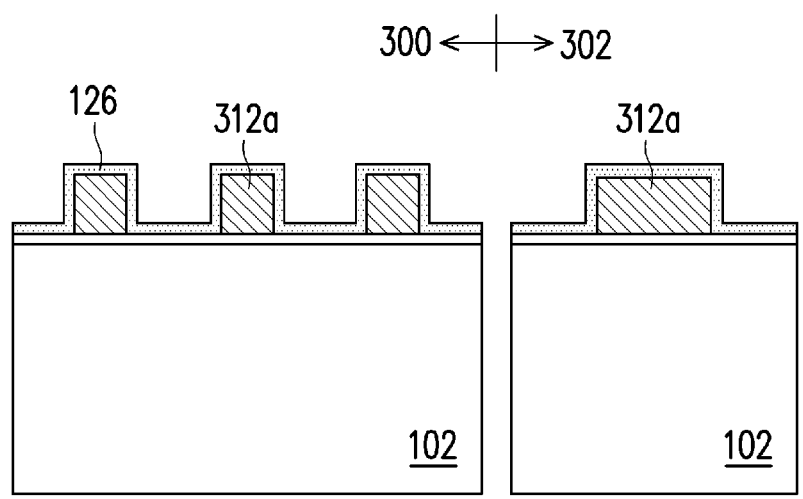
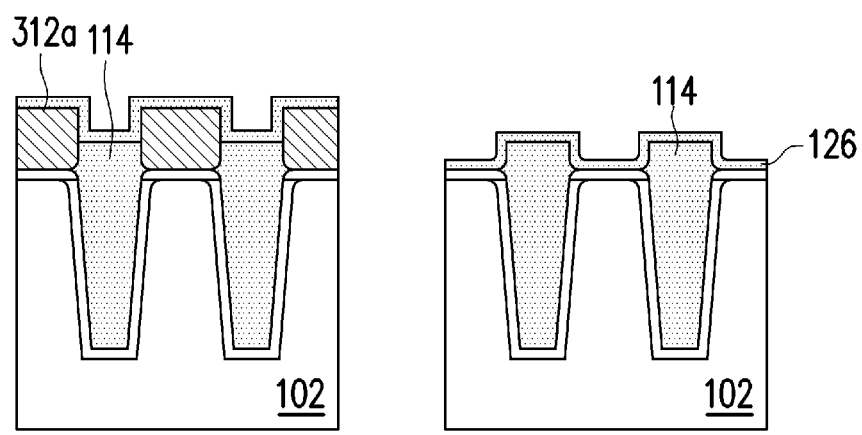
FIG. 3J

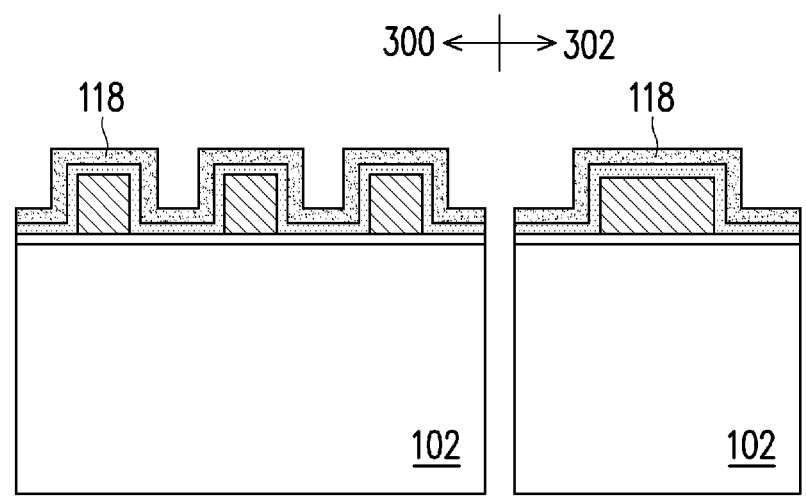
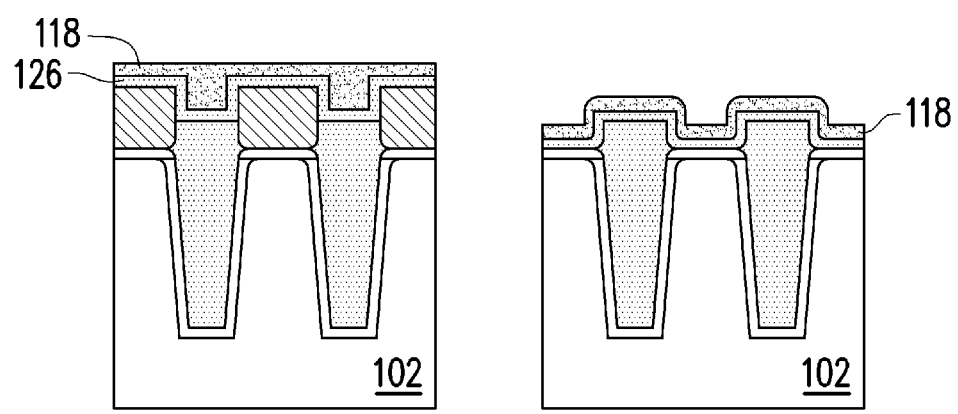
FIG. 3K

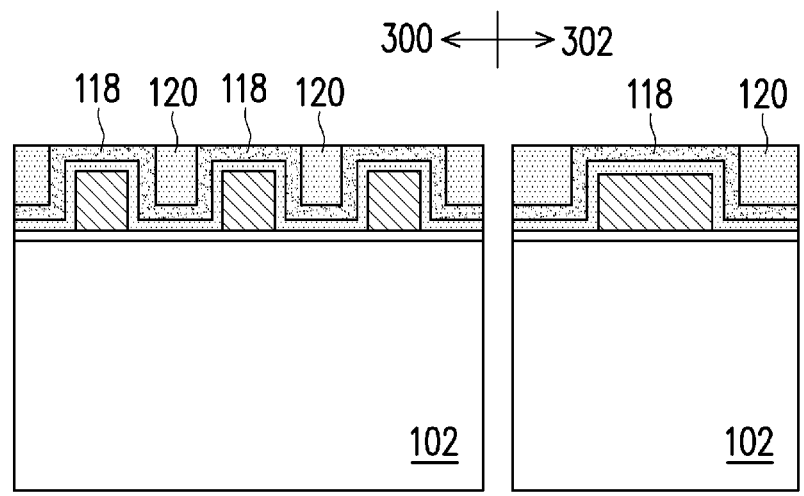
(1)
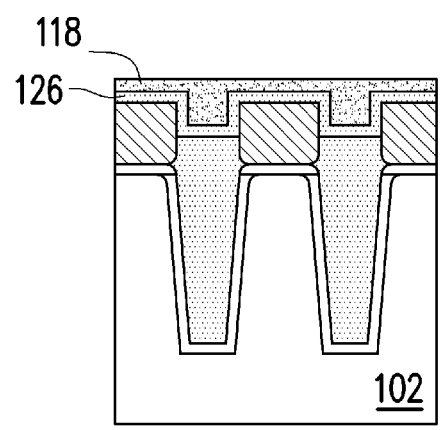
(2)
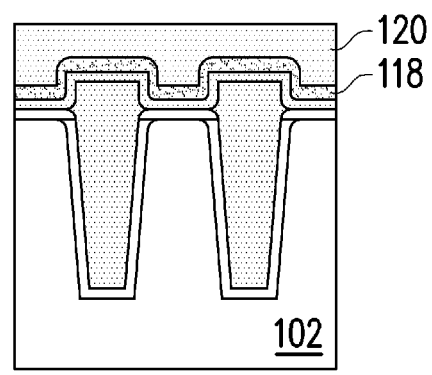
(3)
FIG. 3L

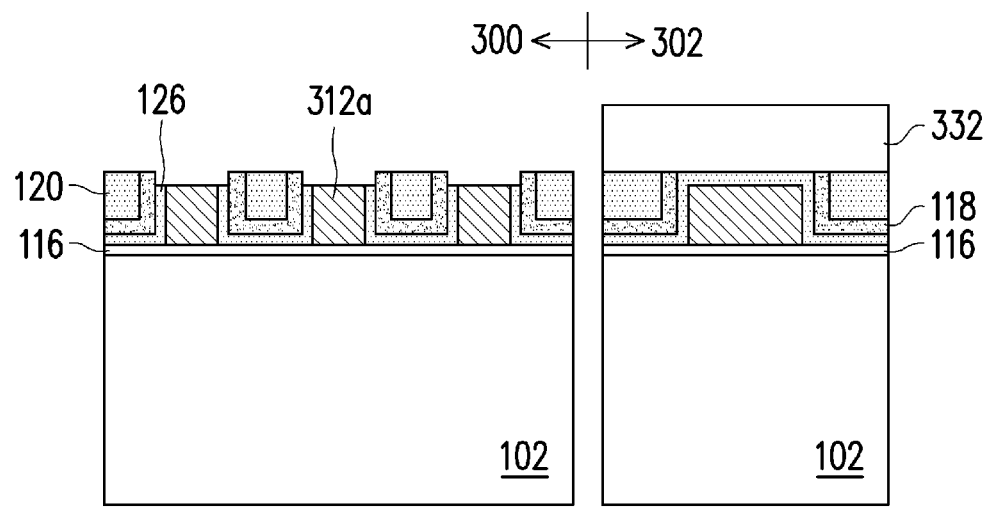
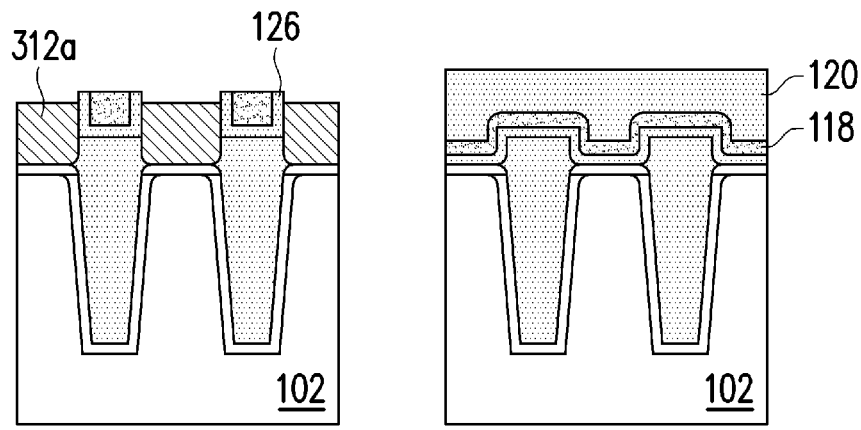
FIG. 3M

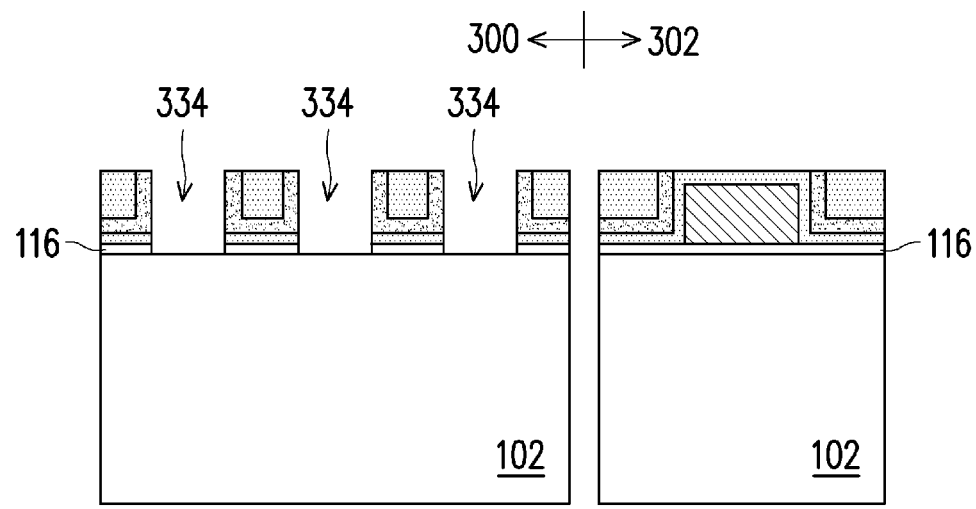
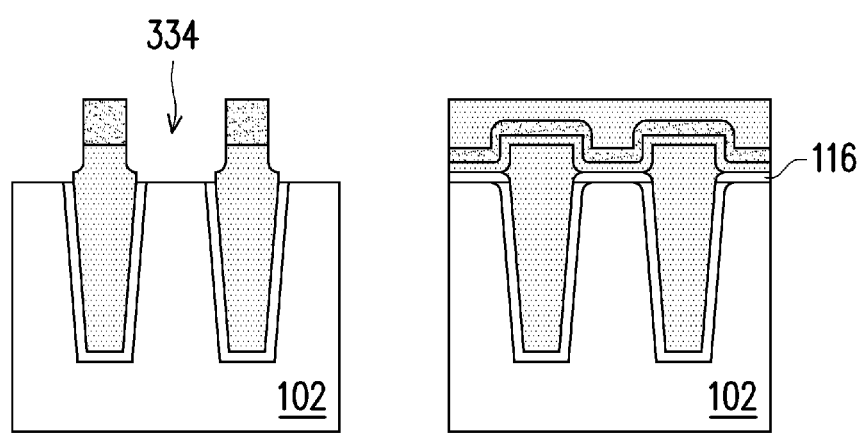
FIG. 3N

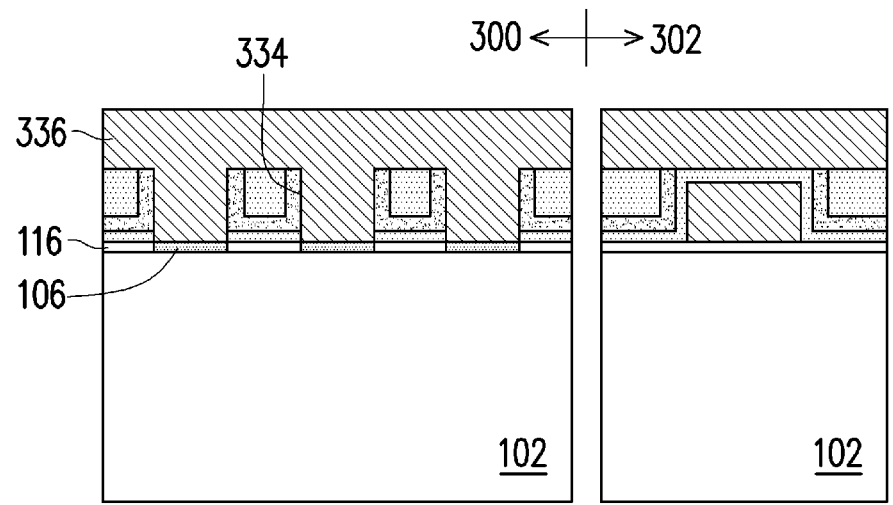
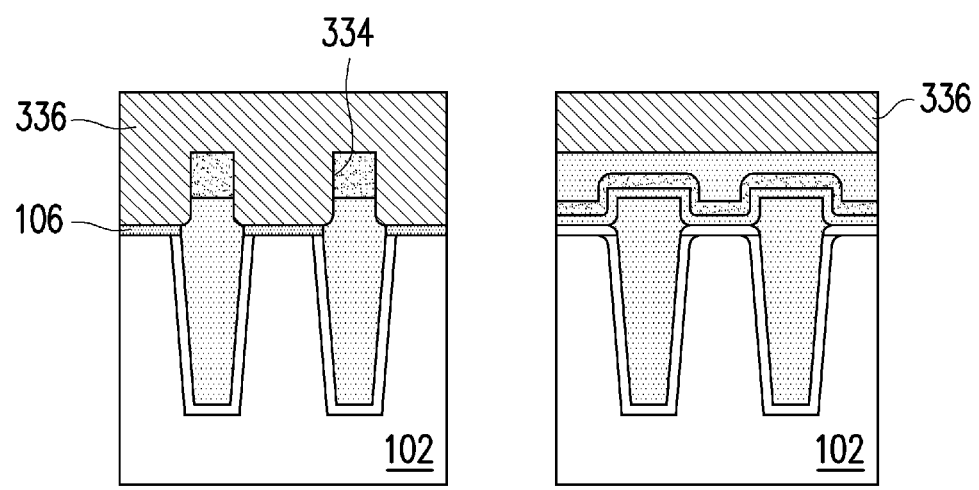
FIG. 30

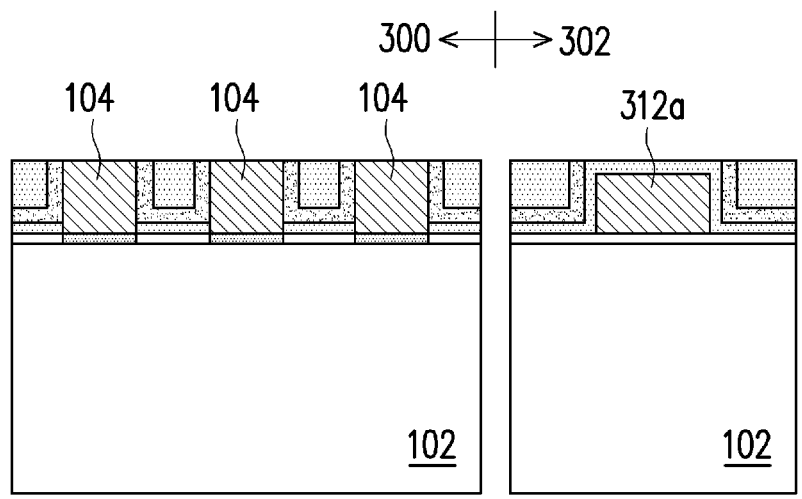
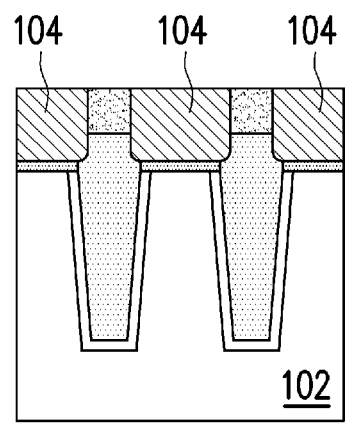
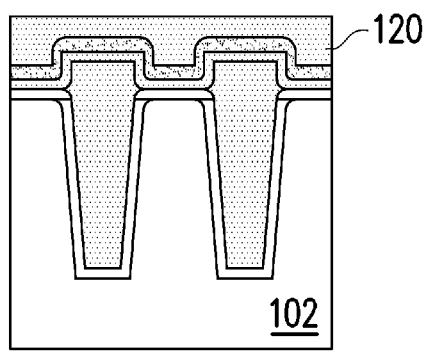
FIG. 3P

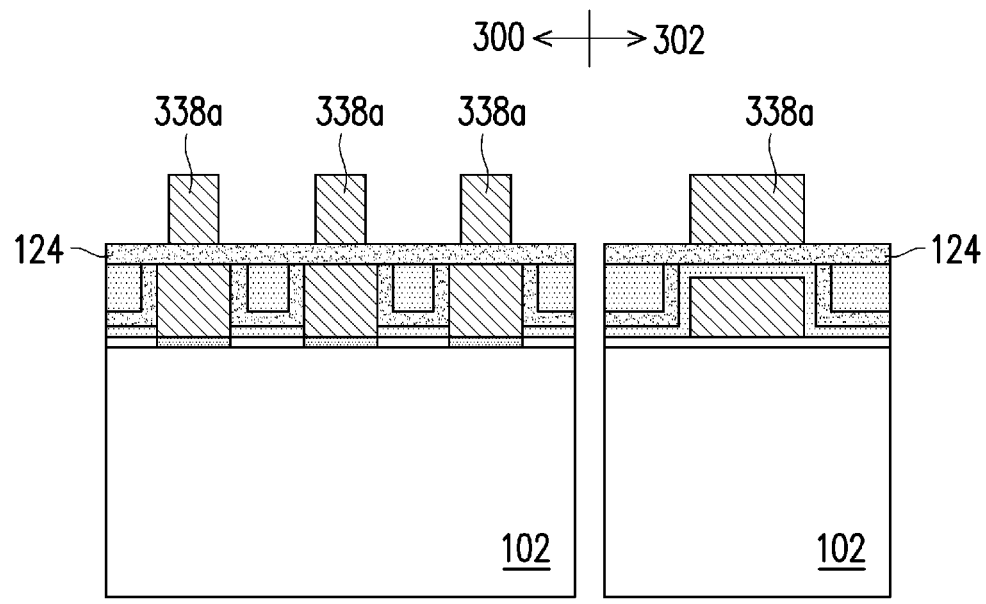
(1)
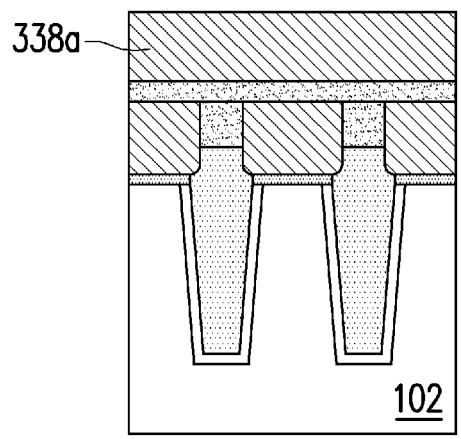
(2)
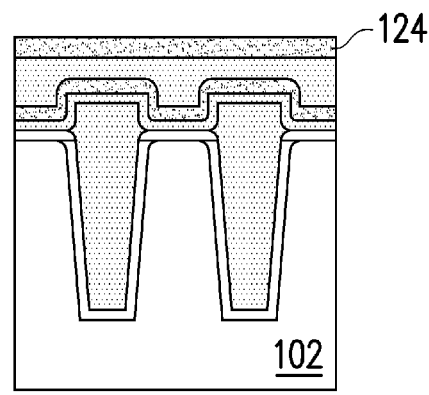
(3)
FIG. 3R

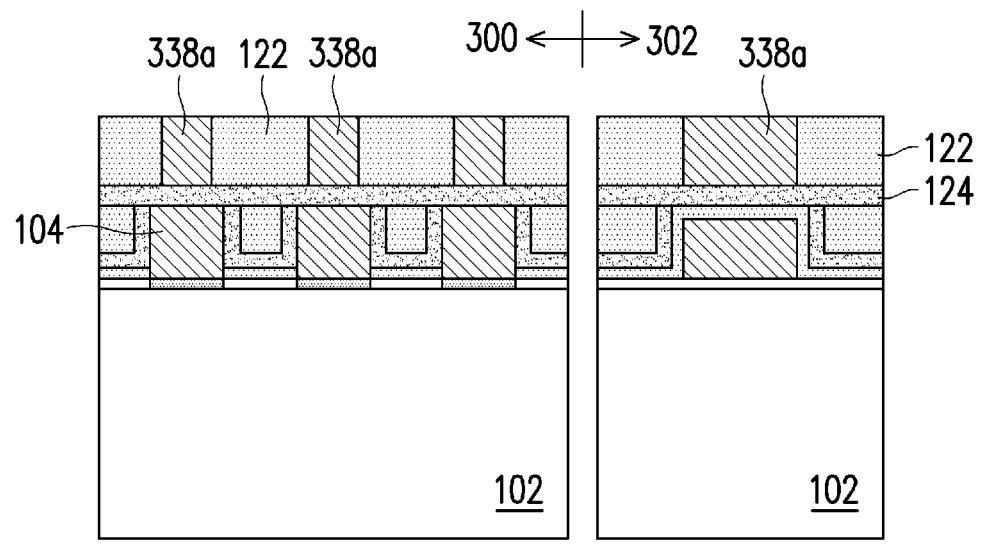
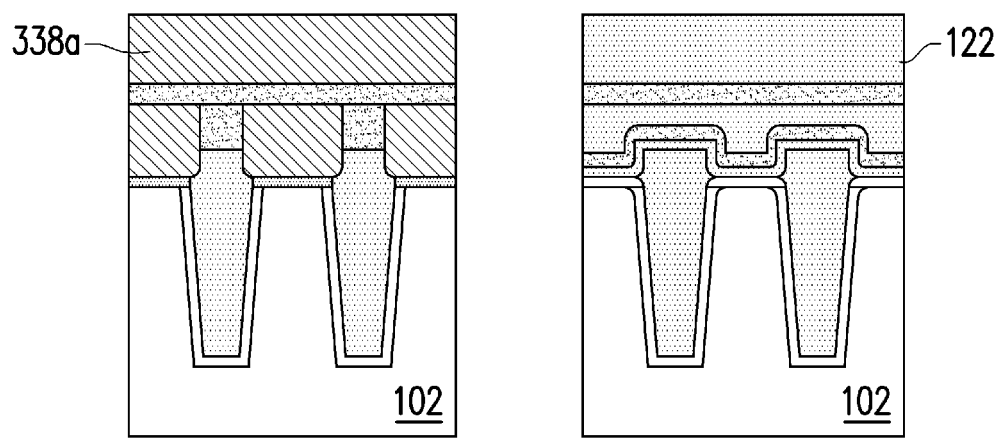
FIG. 3S

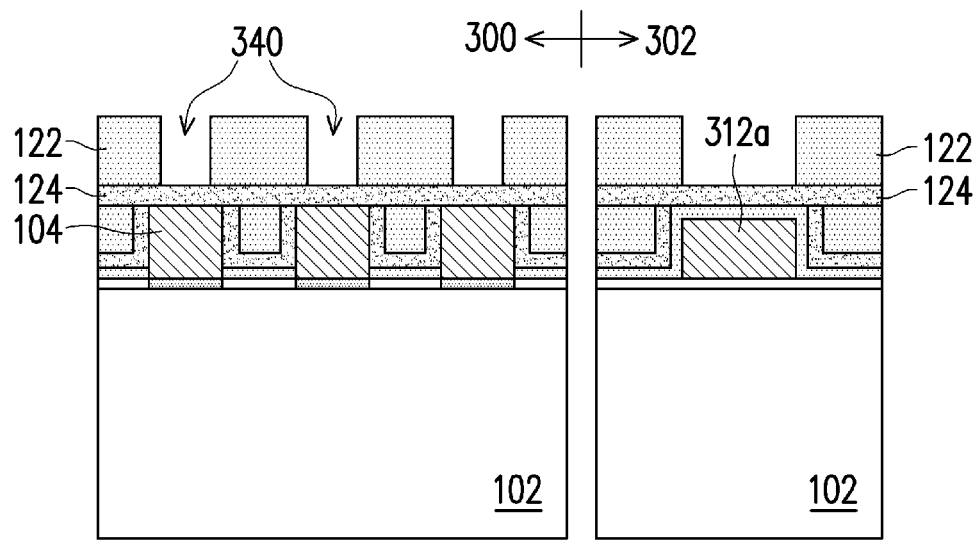
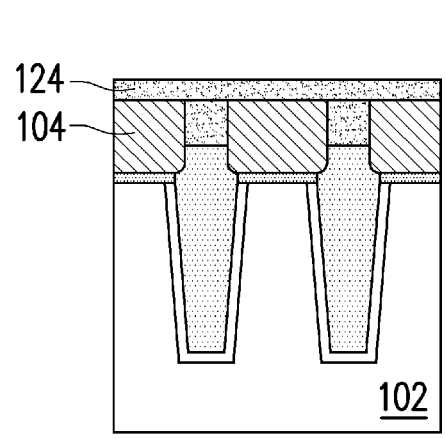 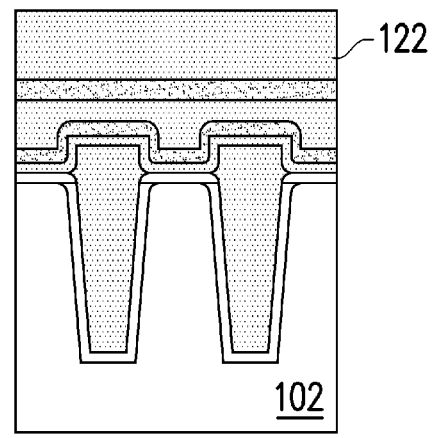
FIG. 3T

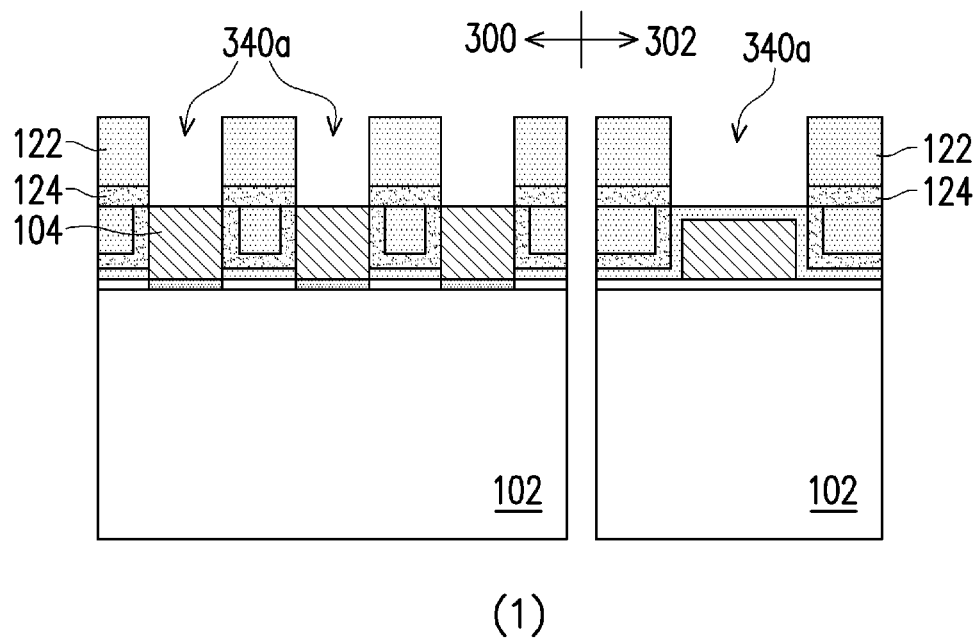
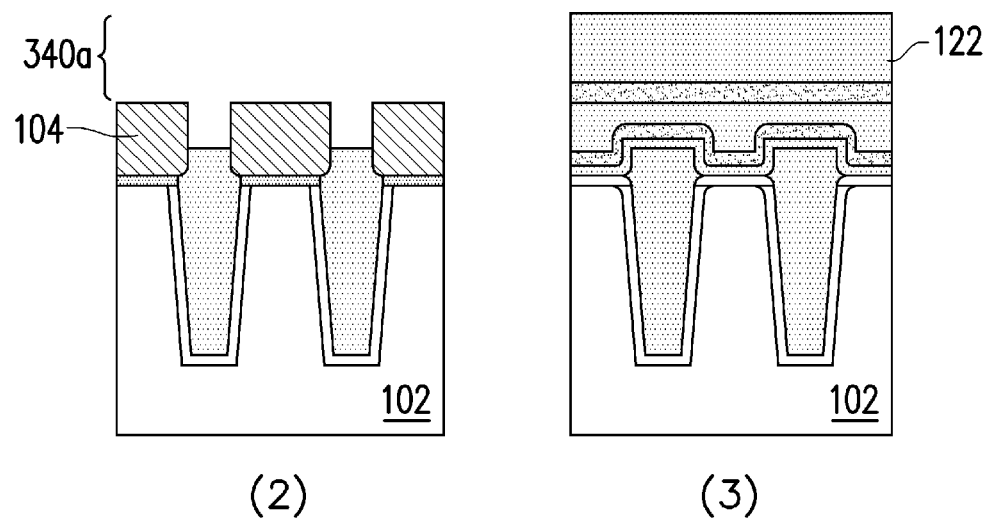
FIG. 3U

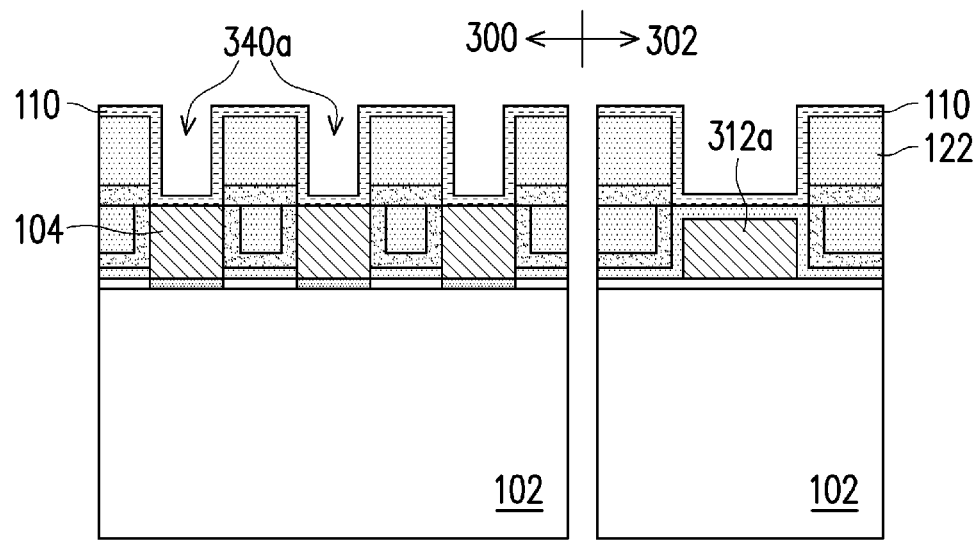
(1)
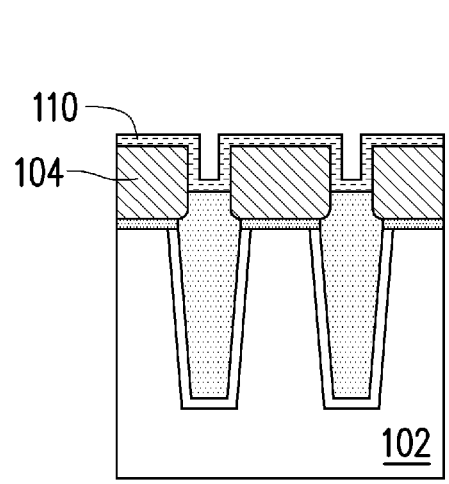
(2)
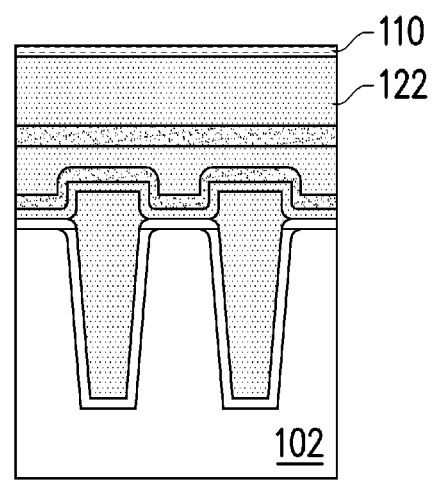
(3)
FIG. 3V

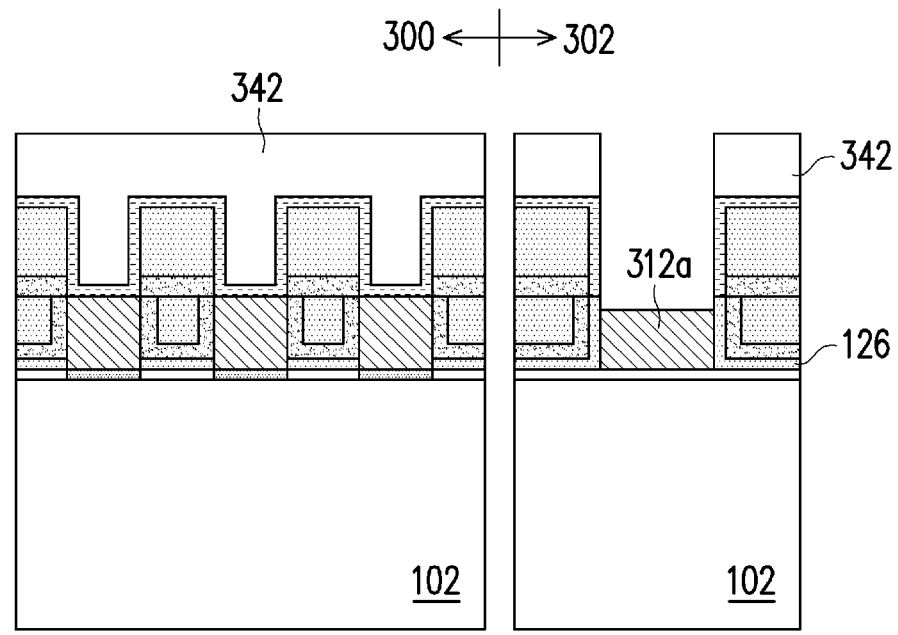
(1)
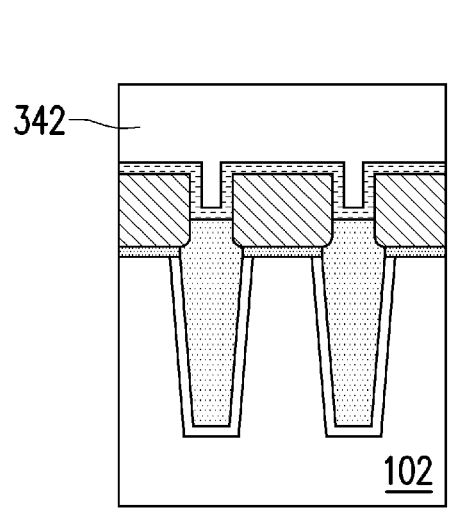
(2)
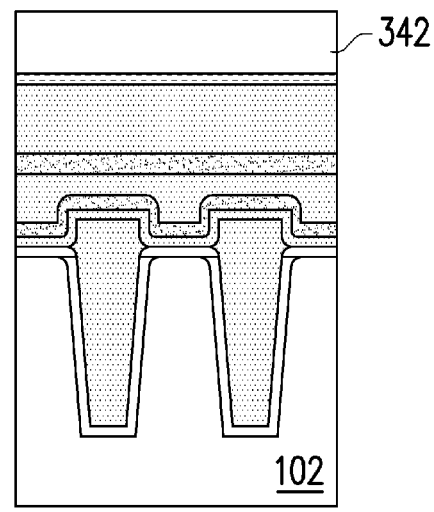
(3)
FIG. 3W

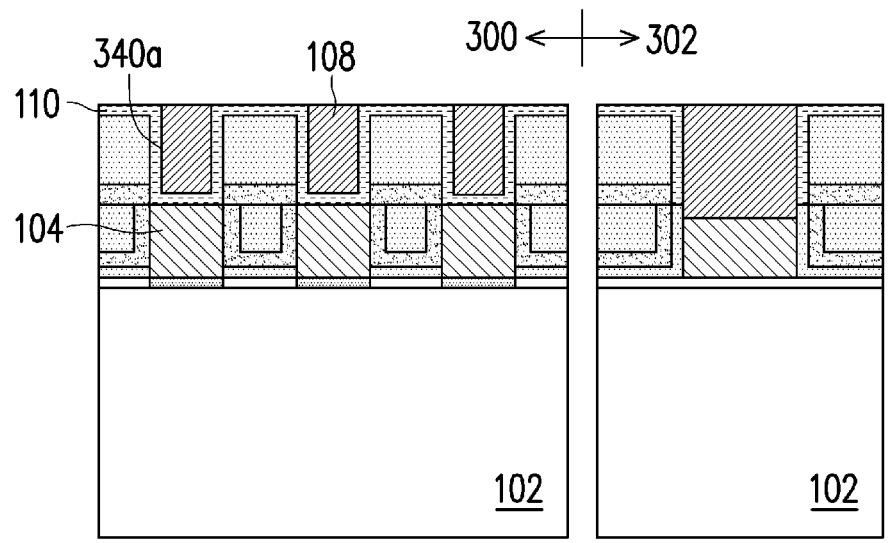
(1)
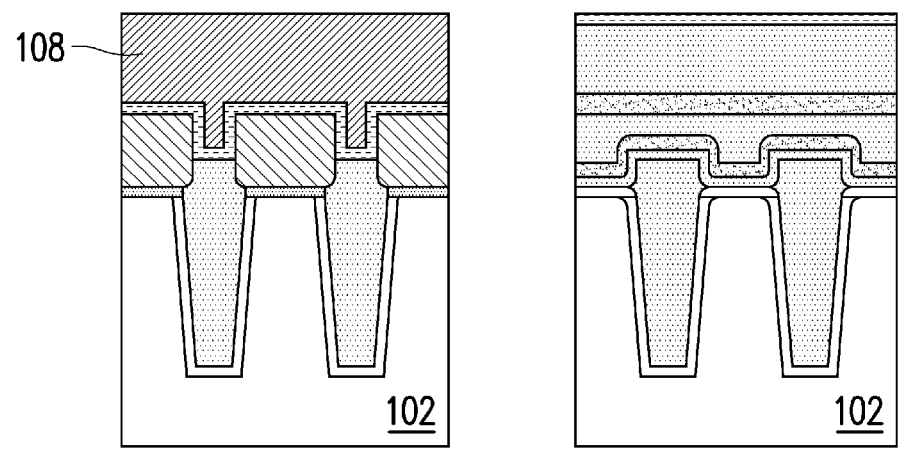
(2) (3)
FIG. 3X

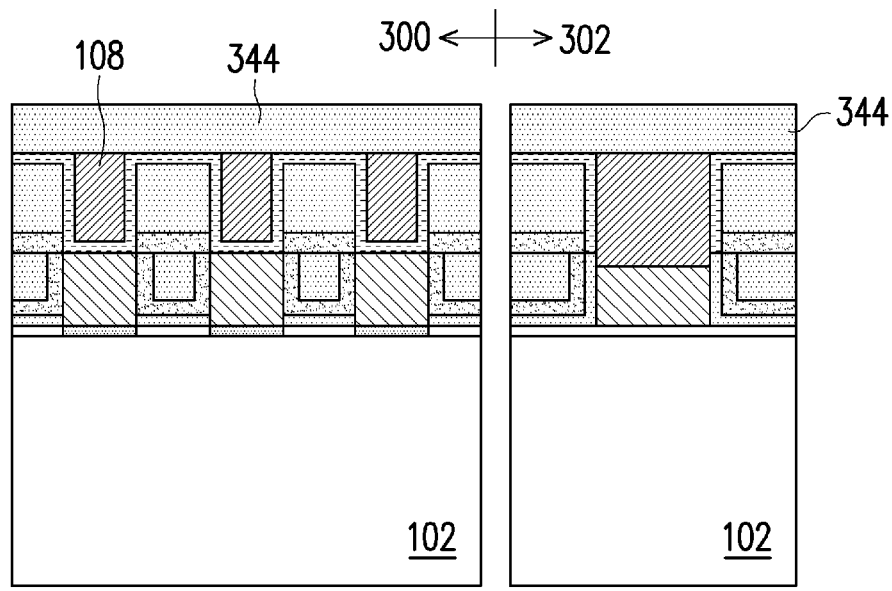
(1)
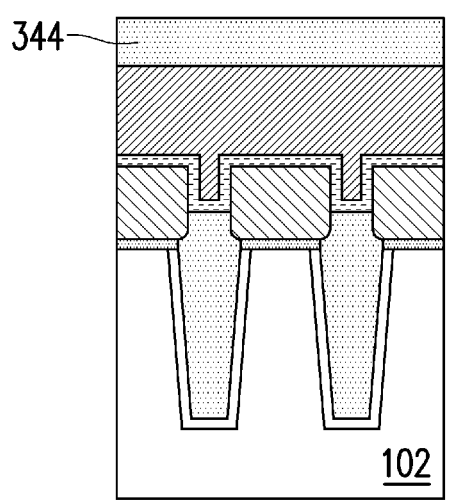
(2)
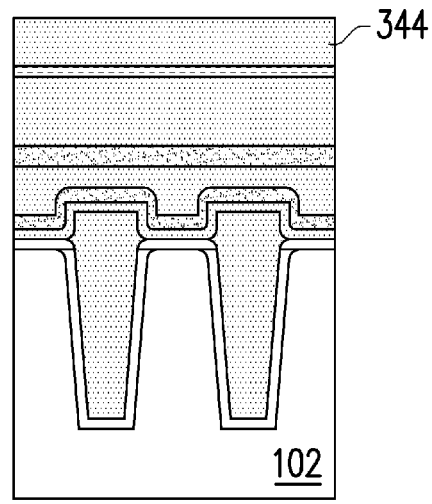
(3)
FIG. 3Y

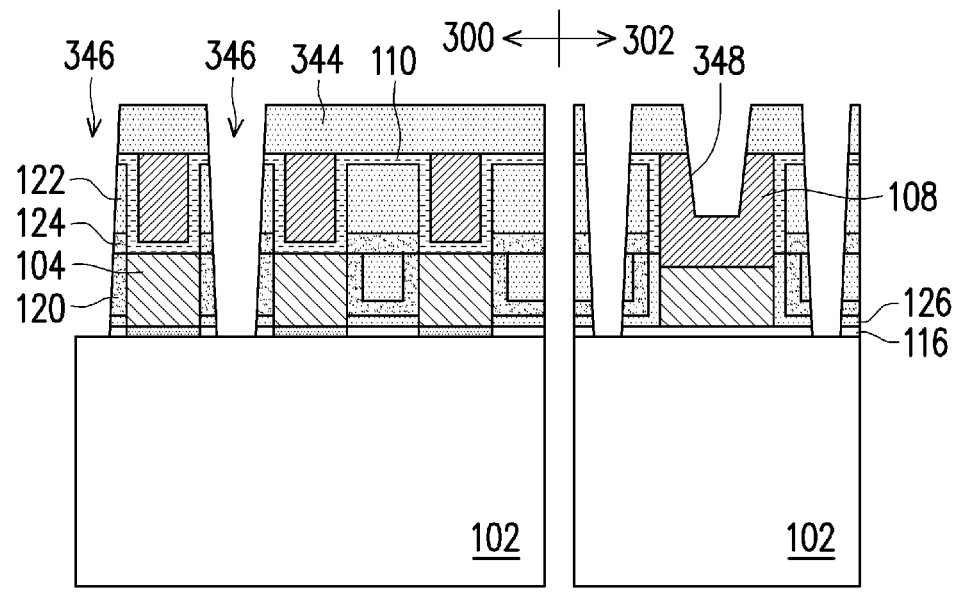
(1)
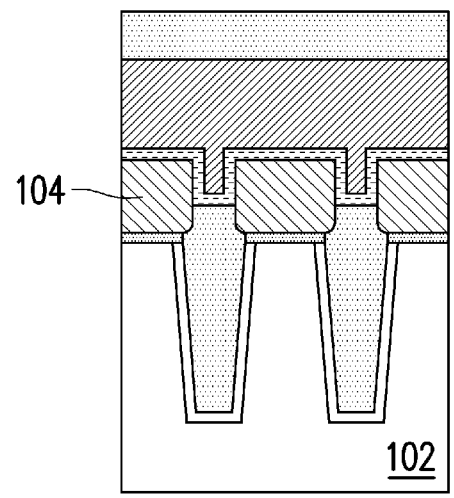
(2)
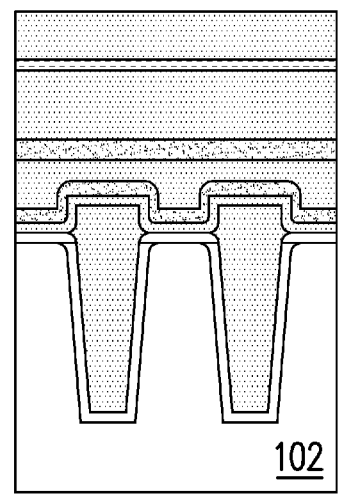
(3)
FIG. 3Z

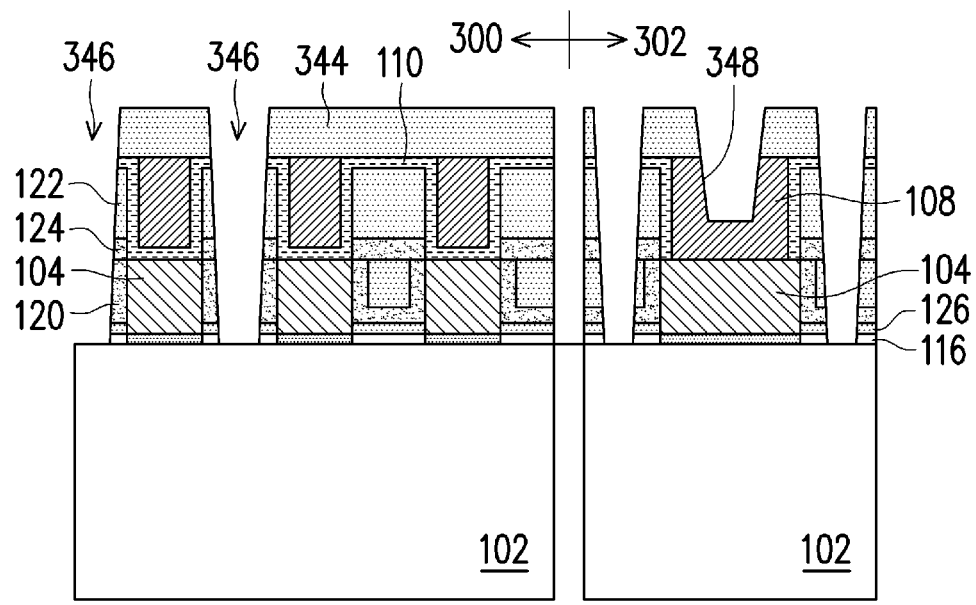
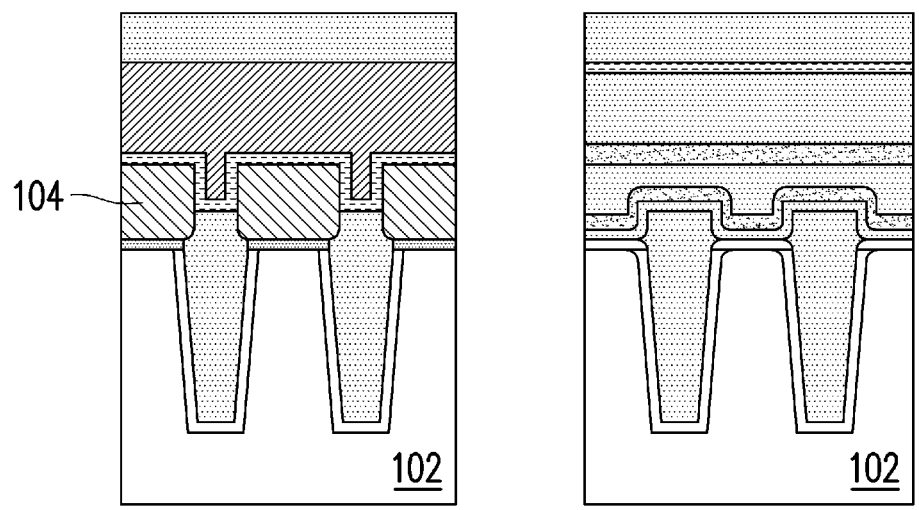
FIG. 4

MANUFACTURING METHOD OF SEMICONDUCTOR DEVICE INCLUDING FLOATING GATE AND CONTROL GATE

CROSS-REFERENCE TO RELATED APPLICATION

This application is a divisional application of U.S. patent application Ser. No. 16/713,020, filed on Dec. 13, 2019, now allowed. The entirety of the above-mentioned patent application is hereby incorporated by reference herein and made a part of this specification.

BACKGROUND OF THE INVENTION

Field of the Invention

The invention relates to a semiconductor technique, and in particular, to a manufacturing method of semiconductor device capable of improving reliability/endurance of data storage.

Description of Related Art

With the miniaturization of the new generation semiconductor processes, the requirements for device reliability and low power consumption are becoming stricter. At present, most advanced processes use high-density plasma reactive-ion etching to define patterns, such as the manufacture of floating gates. However, high-density plasma causes plasma damage and is not conducive to the stored data of the device, thus adversely affecting device reliability.

SUMMARY OF THE INVENTION

The invention provides a manufacturing method of the semiconductor device to improve device reliability.

The manufacturing method of the semiconductor device of the invention includes the following steps. A pad oxide layer is deposited on a substrate. A first sacrificial material is formed on the pad oxide layer. A portion of the first sacrificial material is etched and removed to form a plurality of first sacrificial patterns at a portion in which a plurality of floating gates is to be formed. A first inner dielectric layer is deposited on the substrate and the first sacrificial patterns are covered. A portion of the first inner dielectric layer is removed until a top of the first sacrificial patterns is exposed. The first sacrificial patterns and the pad oxide layer are removed. A plurality of openings is formed to expose the substrate at a portion in which the plurality of floating gates is to be formed. A tunneling dielectric layer is formed on a surface of the substrate exposed in the openings, and a polysilicon is filled in the openings. The polysilicon is planarized to form the plurality of floating gates on the tunneling dielectric layer. Then, a hard mask layer is formed on the first inner dielectric layer and the floating gates, and a second sacrificial material is formed on the hard mask layer. A portion of the second sacrificial material is etched and removed to form a plurality of second sacrificial patterns at a portion in which a plurality of control gates is to be formed, and then a second inner dielectric layer is deposited on the substrate and the second sacrificial patterns are covered. A portion of the second inner dielectric layer is removed until a top of the second sacrificial patterns is exposed. The second sacrificial patterns and the hard mask layer are removed to form a plurality of trenches in the second inner dielectric layer and expose a surface of the floating gates. Then, an ONO layer is conformally deposited on the surface of the floating gates, an inner surface of the trenches, and a surface of the second inner dielectric layer, and a conductive material is filled in the trenches, and then the conductive material is planarized to form a plurality of control gates in the trenches.

Based on the above, the process adopted by the invention completely avoids the use of reactive-ion etching (R.I.E.) during gate formation to reduce charge trap caused by high-density plasma damage to the gates, and the reliability of data storage may be improved. In addition, if metal gates are used as control gates in the invention to control the floating gates, a low-power device may be better formed.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 is a cross-sectional view of a semiconductor device according to yet another embodiment of the invention.

DESCRIPTION OF THE EMBODIMENTS

Figure 1:
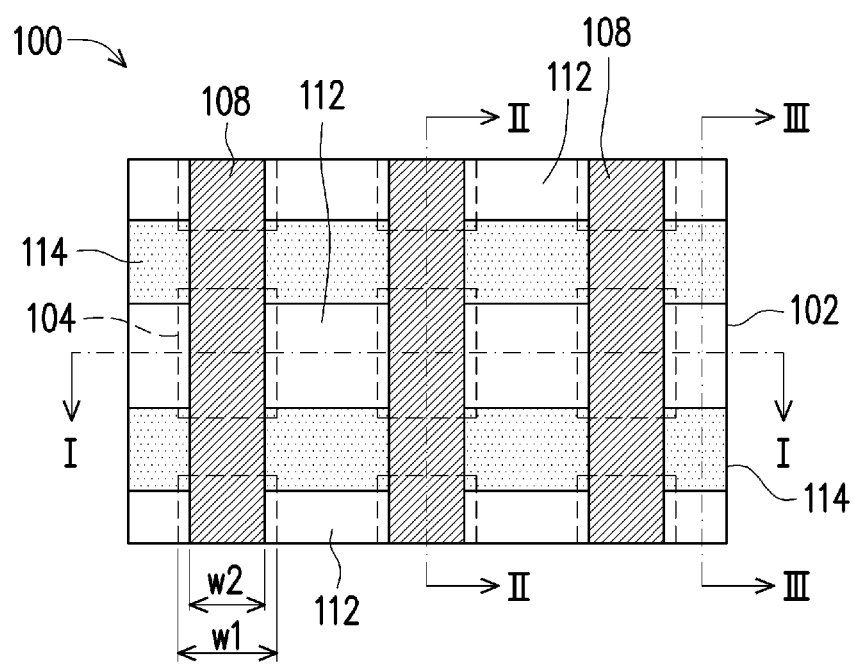
FIG. 1 is a top view of a semiconductor device according to an embodiment of the invention.

The figures in the following embodiments are intended to more comprehensively describe the exemplary embodiments of the inventive concept, but the invention may still be implemented in many different forms, and the invention should not be construed as limited to the recited embodiments. In the figures, for clarity, the relative thickness and location of film layers, regions, and/or structural devices may be reduced or enlarged. Moreover, the same or similar reference numerals represent the same or similar devices and are not repeated in the following paragraphs.

Figure 2A:
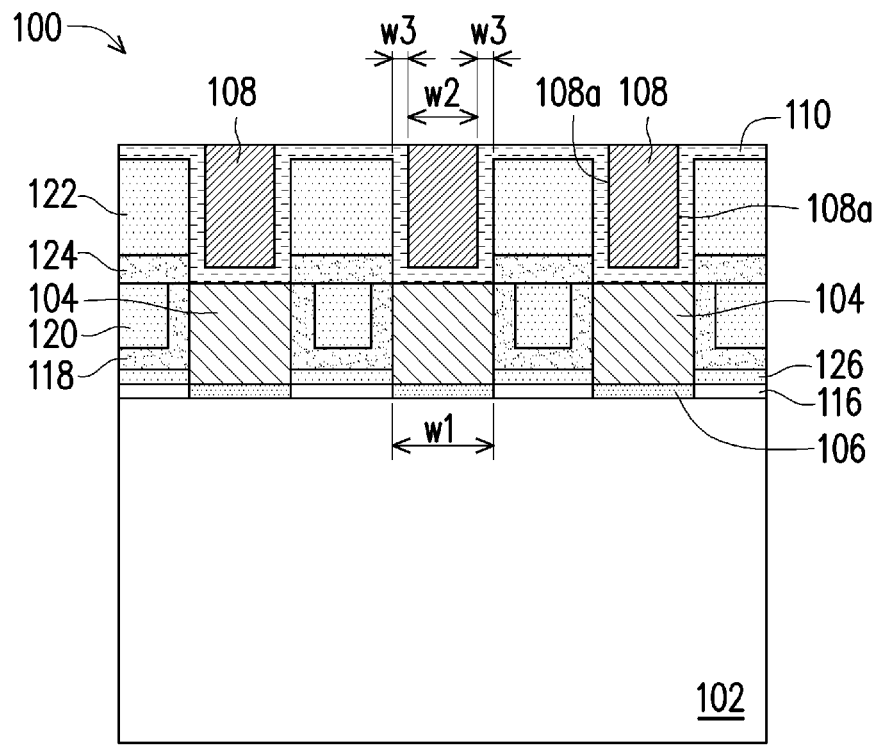
FIG. 2A is a cross-sectional view of the semiconductor device of FIG. 1 at section line I-I.
Figure 2B:
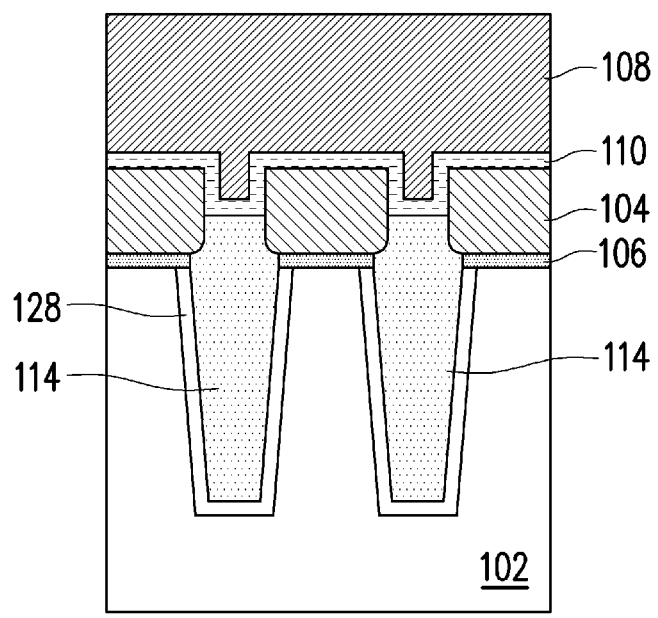
FIG. 2B is a cross-sectional view of the semiconductor device of FIG. 1 at section line II-II.
Figure 2C:
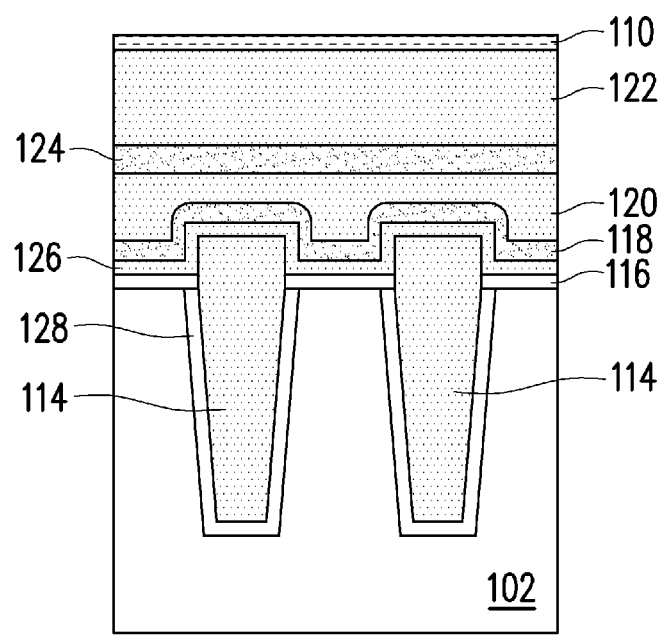
FIG. 2C is a cross-sectional view of the semiconductor device of FIG. 1 at section line III-III.

FIG. 1 is a top view of a semiconductor device according to an embodiment of the invention. FIG. 2A, FIG. 2B, and FIG. 2C are cross-sectional views of the semiconductor device at section line I-I, section line II-II, and section line III-III of FIG. 1, respectively.

Referring to FIG. 1 and FIG. 2A to FIG. 2C, a semiconductor device 100 in the present embodiment includes a substrate 102, a plurality of floating gates 104, a tunneling dielectric layer 106, a plurality of control gates 108, and an ONO layer 110. In FIG. 1, some devices are omitted for clarity, and the floating gates 104, the control gates 108, and isolation structures 114 for defining active regions 112 are shown. The floating gates 104 are located on the substrate 102, and the tunneling dielectric layer 106 is located between the substrate 100 and each of the floating gates 104, and a pad oxide layer 116 or other film layers may be formed on the substrate 102 outside the tunneling dielectric layer 106. In addition, there is a silicon nitride layer 118 having a U-shaped cross section between adjacent floating gates 104. The control gates 108 are located on the floating gates 104, and the ONO layer 110 is located on two sidewalls 108a of each of the control gates 108 and between each of the control gates 108 and each of the floating gates 104.

Both the formation of the floating gates 104 and the formation of the control gates 108 may include first depositing and etching sacrificial patterns (not shown) having the same structure at a portion in which the floating gates 104 and the control gates 108 are to be formed, then forming material layers such as the U-shaped silicon nitride layer 118 and inner dielectric layers 120 and 122, then removing the sacrificial patterns to leave a space, and then forming the floating gates 104 and the control gates 108 in the space. Therefore, the floating gates 104 and the control gates 108 do not need to be defined via high-density plasma reactive-ion etching (R.I.E.), thereby avoiding plasma damage caused by high-density plasma to improve device reliability. In addition, since the control gates 108 do not need to be defined via plasma etching, metal gates may be directly formed to control the floating gates, thus facilitating forming a low-power device. However, the invention is not limited thereto, and the control gates 108 may be polysilicon gates. In the present embodiment, a width w1 of each of the floating gates 104 is greater than a width w2 of each of the control gates 108. Moreover, due to the manufacturing process, the width w1 of each of the floating gates 104 is substantially equal to the sum of the width w2 of each of the control gates 108 and a width w3 of the ONO layer 110 located on the two sidewalls 108a of each of the control gates 108 (w1=w2+2×w3).

In addition, in the semiconductor device 100, for the adhesion of the front and rear layers or process requirements, a hard mask layer 124 may be disposed between the inner dielectric layers 120 and 122, another oxide layer 126 may be disposed between the pad oxide layer 116 and the silicon nitride layer 118, and a liner oxide layer 128 may be formed between the isolation structures 114 and the substrate 102. However, the invention is not limited thereto, and the film layers may also be omitted or replaced with other materials due to design changes.

Hereinafter, a manufacturing method of a semiconductor device of the invention is described in detail, but the invention is not limited thereto. Some steps in the following embodiments may be omitted, or other steps may be added according to requirements.

Figure 3A:
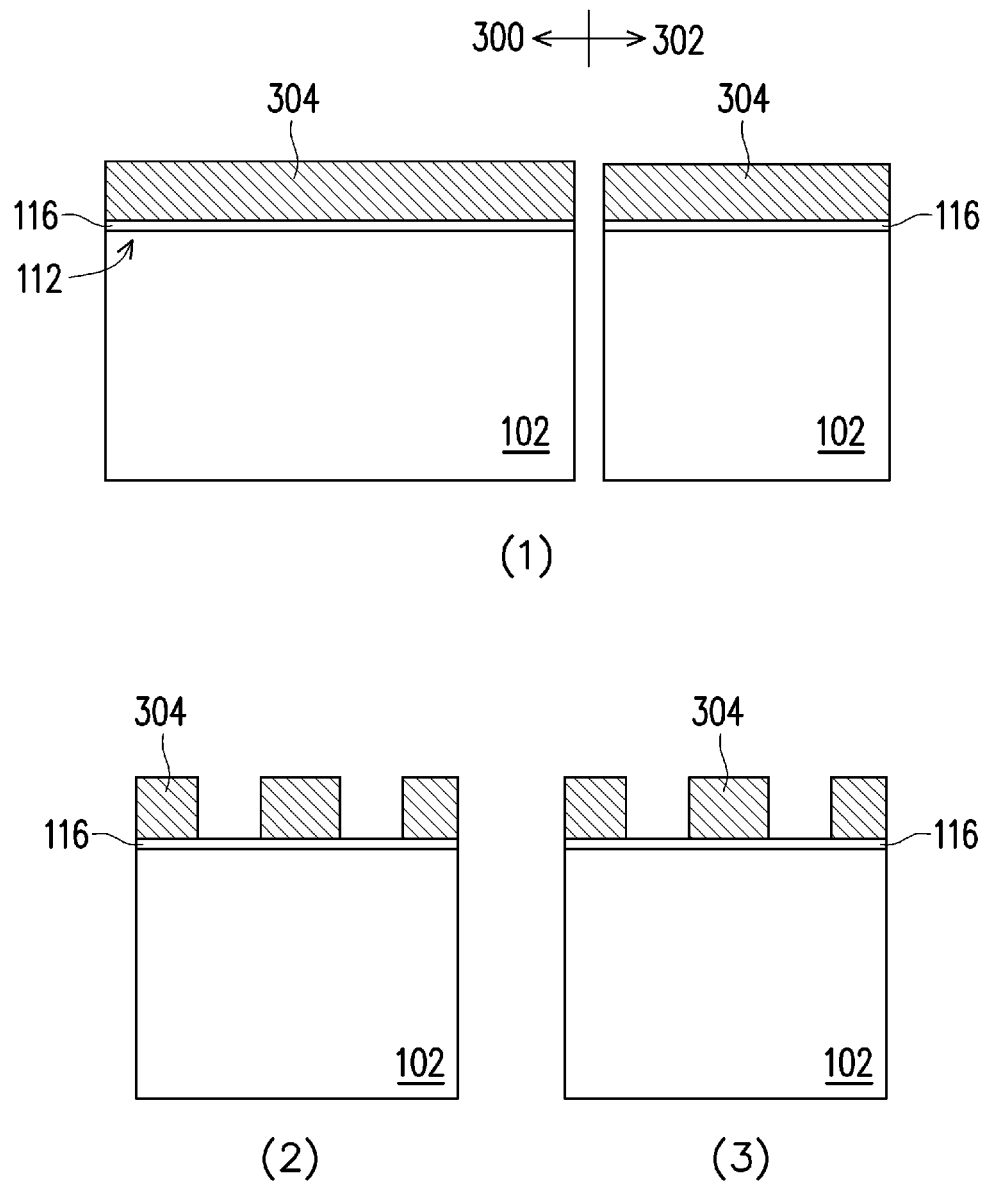
FIG. 3A to FIG. 3Z are cross-sectional views of a manufacturing process of a semiconductor device according to another embodiment of the invention.

FIG. 3A to FIG. 3Z are cross-sectional views of a manufacturing process of a semiconductor device according to another embodiment of the invention, wherein part (1) of each figure is compared to the cross section of section line I-I of FIG. 1 (i.e., a unit region 300) and includes a peripheral circuit region 302 not shown in FIG. 1; part (2) is compared to the cross section of section line II-II of FIG. 1; and part (3) is compared to the cross section of section line III-III of FIG. 1. In addition, in FIG. 3A to FIG. 3Z, the same reference numerals as the previous embodiment are used to represent the same or similar devices, and a portion of the technical descriptions omitted, such as the position, size, and materials of each layer or region is provided in the previous embodiment and is therefore not repeated herein.

Referring first to FIG. 3A, the pad oxide layer 116 is deposited on the substrate 102. In order to define active regions (not shown) and form sacrificial patterns (not shown), a silicon nitride layer may be first deposited on the pad oxide layer 116 and patterned to obtain a patterned silicon nitride layer 304.

Figure 3B:
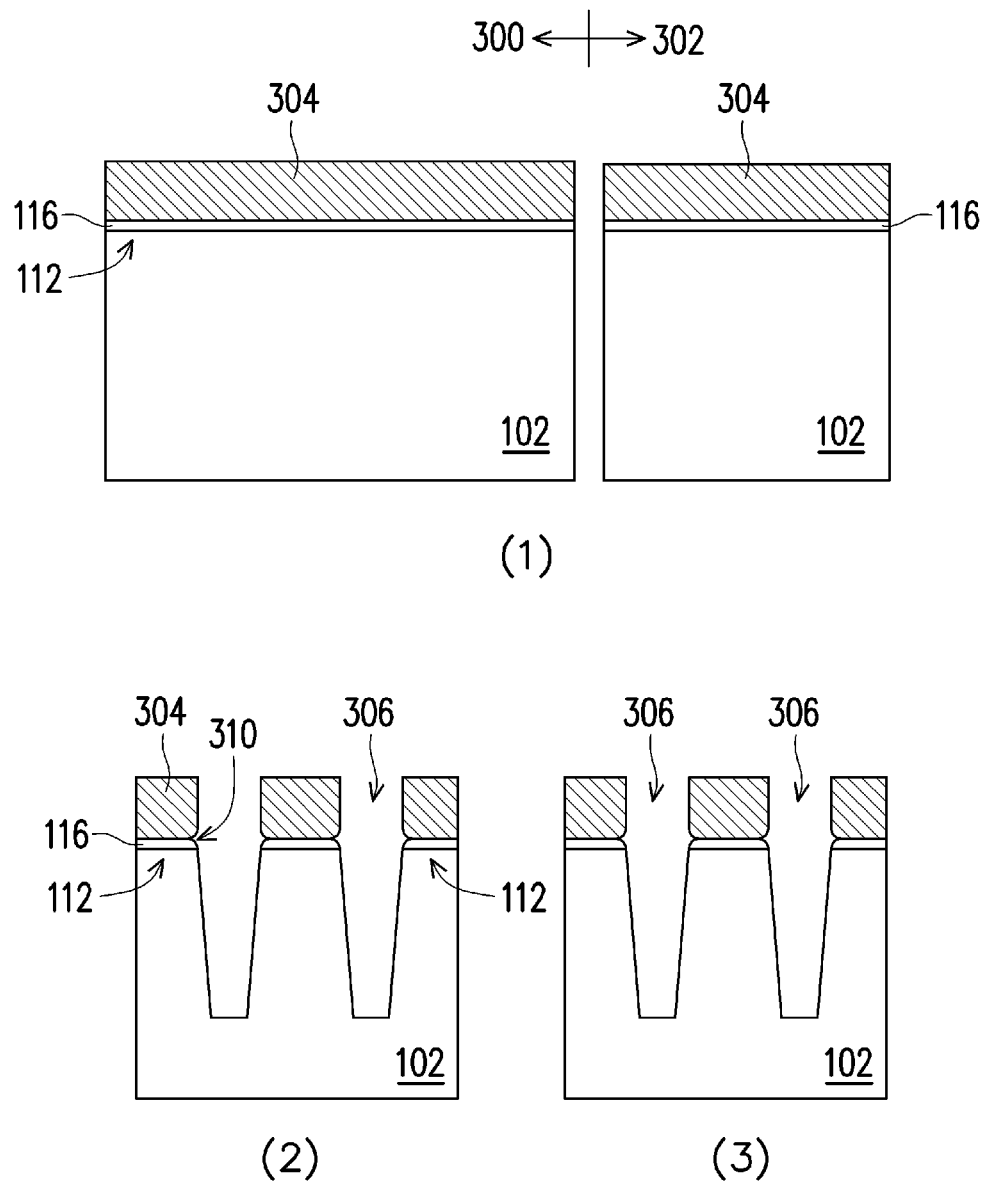

Then, referring to FIG. 3B, the patterned silicon nitride layer 304 is used as an etch mask, and the pad oxide layer 116 and the substrate 102 are etched to form a plurality of isolation trenches 306 in the substrate 102 and define the plurality of active regions 112. Moreover, due to the etch selectivity between the patterned silicon nitride layer 304, the pad oxide layer 116, and the substrate 102, the surfaces of the pad oxide layer 116 and the substrate 102 may have rounded corners, and a side surface 310 at the junction of the patterned silicon nitride layer 304 and the pad oxide layer 116 is slightly retracted.

Next, referring to FIG. 3C, the liner oxide layer 128 may be formed in the isolation trenches 306 first, then the isolation structures 114 are formed and the patterned silicon nitride layer 304 is exposed. In an embodiment, the isolation structures 114 are formed by, for example, first filling a spin-on glass (SOG) in the isolation trenches 306 to facilitate trench filling, and then, after the SOG is cured, depositing high-density plasma (HDP) oxide on the cured SOG.

Figure 3D:
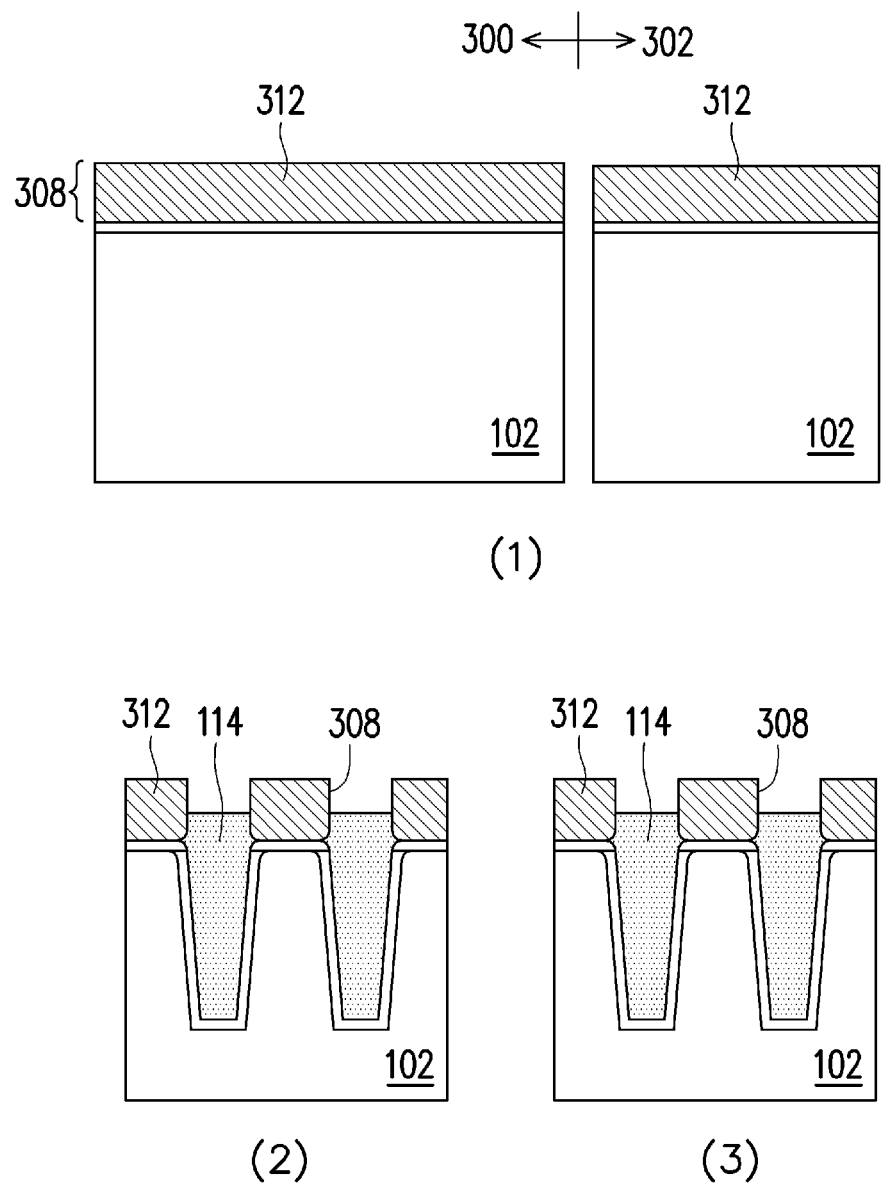

Next, referring to FIG. 3D, after the patterned silicon nitride layer 304 of FIG. 3C is cured, a plurality of sacrificial trenches 308 are formed. Then, a first sacrificial material 312 is filled in the sacrificial trenches 308 and the isolation structures 114 are exposed, and a portion of the isolation structures 114 is removed to expose a sidewall of the first sacrificial material 312.

Then, referring to FIG. 3E, a portion of the first sacrificial material is etched and removed to form a plurality of first sacrificial patterns 312a at a portion in which a plurality of floating gates (not shown) are to be formed. At least one first sacrificial pattern 312a is formed on the inside of the peripheral circuit region 302, and due to different functions, the first sacrificial pattern 312a in the peripheral circuit region 302 is greater (or wider). The above is an example of forming the first sacrificial pattern 312a, but the invention is not limited thereto. The first sacrificial pattern 312a may also not be related to the formation of the isolation structures 114, but after the isolation structures 114 are formed, a first sacrificial material is additionally formed and etched to define a plurality of first sacrificial patterns 312a.

Figure 3F:
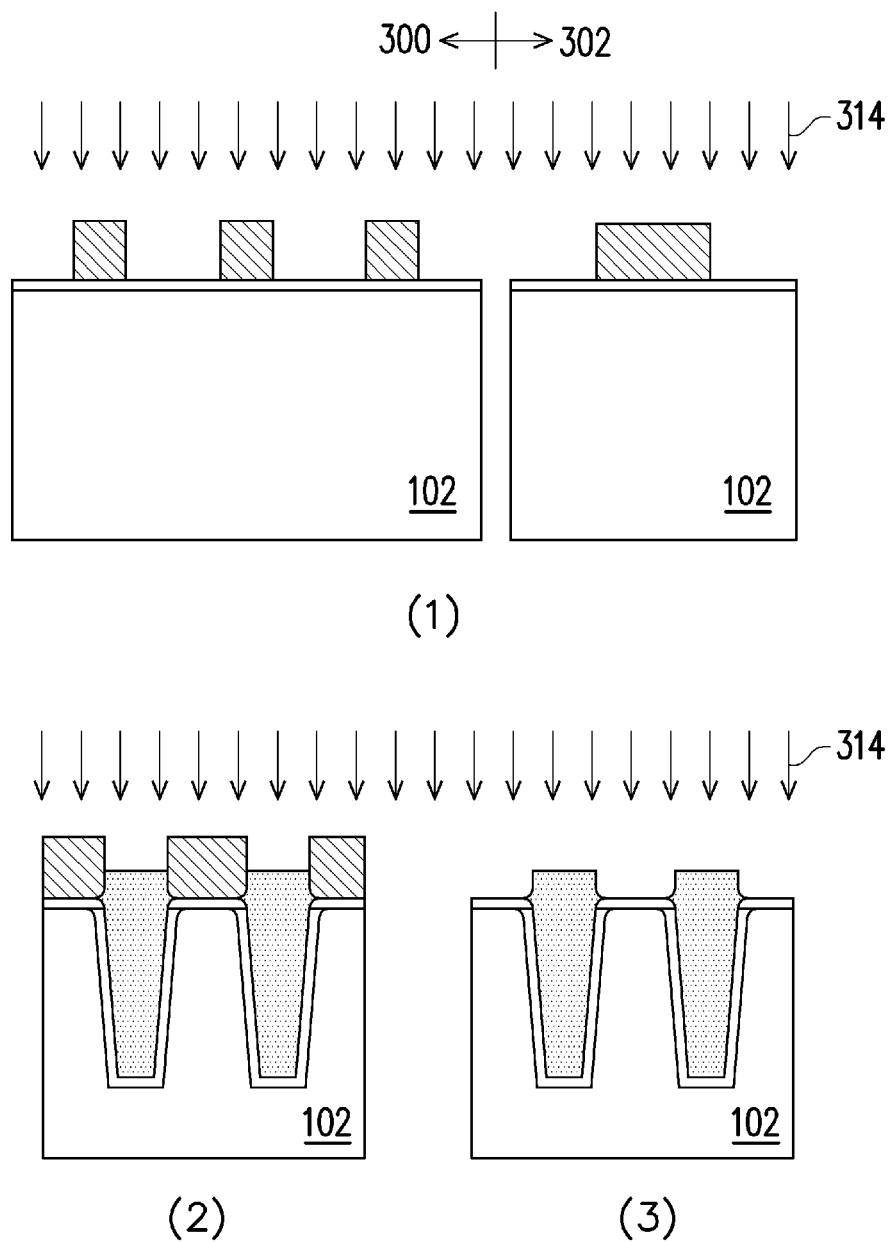

Next, referring to FIG. 3F, a low-doped drain (LDD) implantation 314 may be performed to form an LDD region (not shown) in the substrate 102 (the unit region 300 and the peripheral circuit region 302).

Then, referring to FIG. 3G, the oxide layer 126 is deposited on the substrate 102 to completely cover the first sacrificial patterns 312a.

Next, referring to FIG. 3H, spacers 318 are formed on the sidewalls of the first sacrificial patterns 312a, and a source and drain (S/D) implantation 320 is performed to form an S/D region (not shown) in the substrate 102. Since the S/D regions needed by the unit region 300 and the peripheral circuit region 302 are different, the substrate 102 of the peripheral circuit region 302 is protected by a protective layer 322, wherein the protective layer 322 is, for example, a photoresist.

Figure 3I:
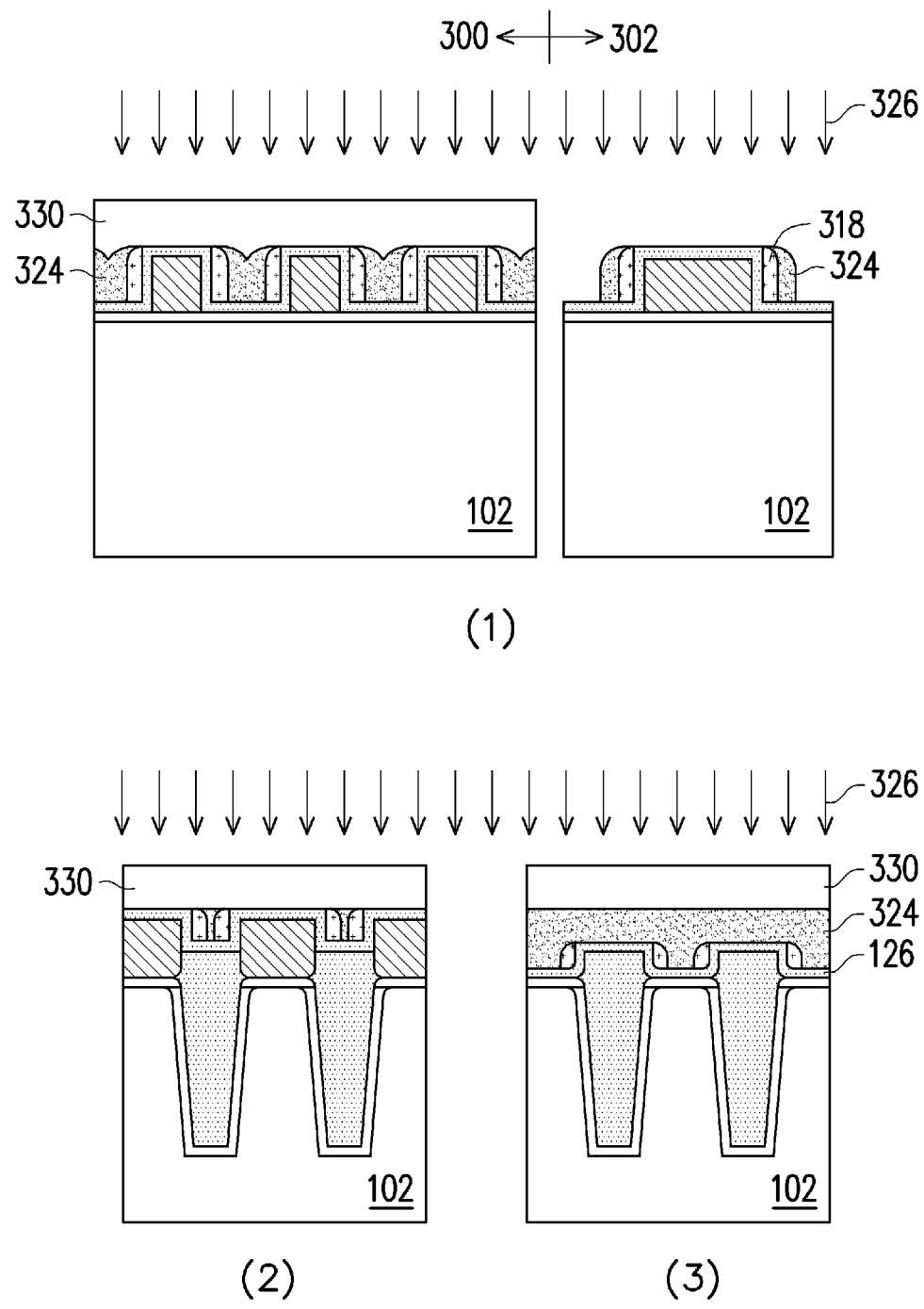

Next, referring to FIG. 3I, after the protective layer 322 of FIG. 3H is removed, another spacer 324 is formed on the outside of the spacers 318, and another source and drain (S/D) implantation 326 is performed to form an S/D region (not shown) in the peripheral circuit region 302, and since the energy of the S/D implantation 326 may be greater, another protective layer 330 may be used to protect the substrate 102 of the unit region 300, wherein the protective layer 330 is, for example, a photoresist.

Then, referring to FIG. 3J, the protective layer 330 and the spacers 318 and 324 in FIG. 3H are removed, leaving only the oxide layer 126. The above steps related to LDD implantation and S/D implantation are optional, and are therefore not limited to be performed at this stage, and may also be performed before the isolation structures 114 are formed.

Subsequently, referring to FIG. 3K, the silicon nitride layer 118 is conformally deposited on the substrate 102 and the first sacrificial patterns 312a are covered.

Next, referring to FIG. 3L, the inner dielectric layer 120 is deposited on the substrate 102 and the first sacrificial patterns 312a are covered, and then a portion of the inner dielectric layer 120 is removed until the top of the silicon nitride layer 118 is exposed, wherein a method of removing a portion of the inner dielectric layer 120 is, for example, chemical-mechanical polishing (CMP).

Then, referring to FIG. 3M, the silicon nitride layer 118 exposed in FIG. 3L is removed first until the oxide layer 126 underneath is exposed, and then the peripheral circuit region 302 is covered via a first protective layer 332, and the exposed oxide layer 126 is removed until the first sacrificial patterns 312a in the unit region 300 are exposed, wherein the first protective layer 332 is, for example, a photoresist.

Then, referring to FIG. 3N, the first sacrificial patterns 312 a and the pad oxide layer 116 underneath are removed to form a plurality of openings 334 exposing the substrate 102 at a portion in which a plurality of floating gates are to be formed. Next, the first protective layer 332 of FIG. 3M is removed.

Then, referring to FIG. 3O, the tunneling dielectric layer 106 is formed on the surface of the substrate 102 exposed in the openings 334, and then a polysilicon 336 is filled in the openings 334.

Next, referring to FIG. 3P, the polysilicon is planarized to form the plurality of floating gates 104 on the tunneling dielectric layer 106. At this time, the first sacrificial pattern 312a still remains in the peripheral circuit region 302, but the invention is not limited thereto. If the material of the first sacrificial pattern 312a is not a conductive material such as polysilicon, then the first protective layer 332 may be omitted in the step of FIG. 3M, so that the first sacrificial pattern 312a in the peripheral circuit region 302 and the pad oxide layer 116 underneath are removed together in the step of FIG. 3N and replaced with the floating gates 104 together in FIG. 3P.

Figure 3Q:
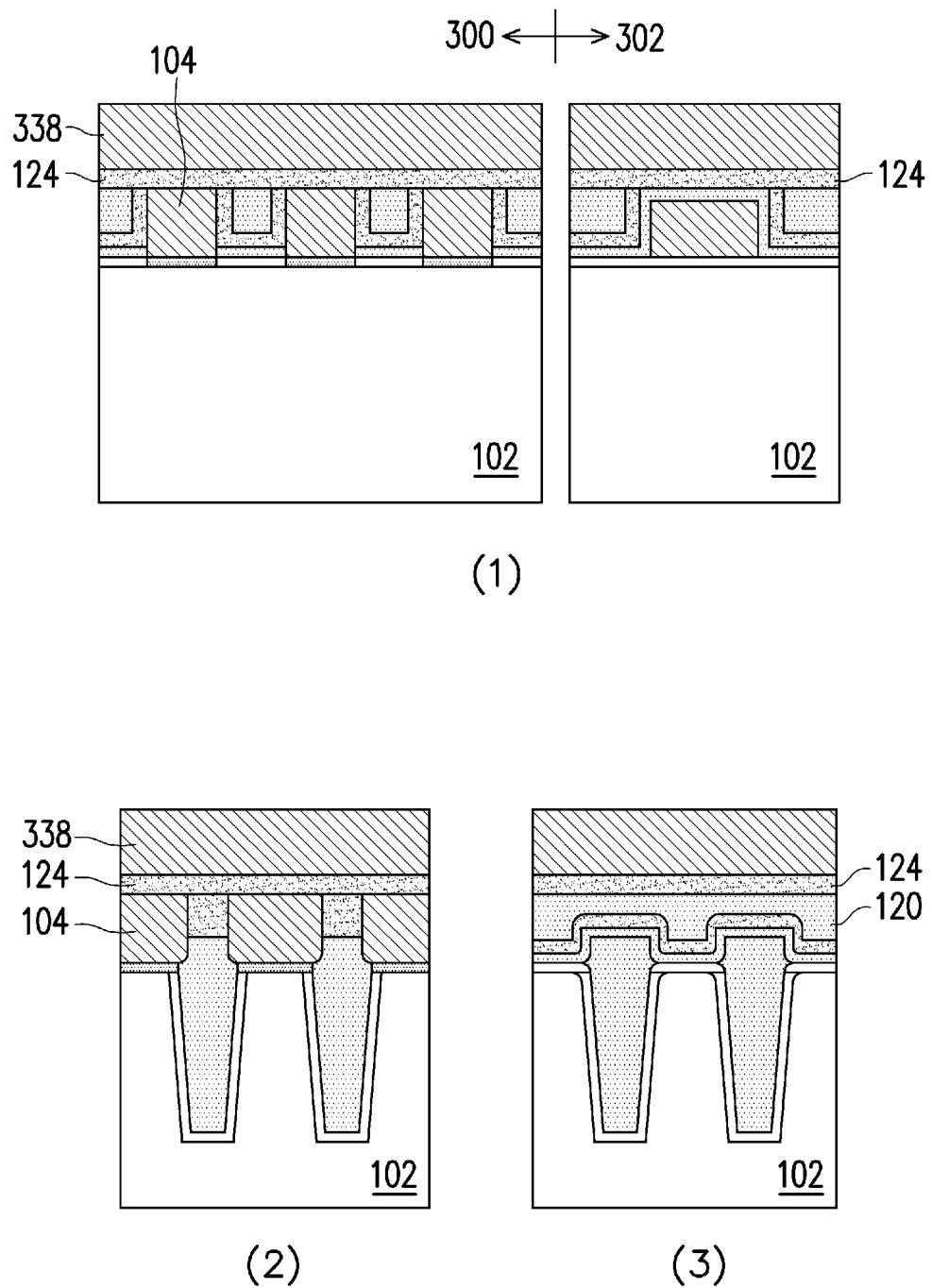

Next, referring to FIG. 3Q, the hard mask layer 124 is formed on the inner dielectric layer 120 and the floating gates 104, and a second sacrificial material 338 is formed on the hard mask layer 124.

Then, referring to FIG. 3R, a portion of the second sacrificial material 338 is etched and removed to form a plurality of second sacrificial patterns 338a at a portion in which a plurality of control gates is to be formed.

Next, referring to FIG. 3S, the inner dielectric layer 122 is deposited on the substrate 102 and the second sacrificial patterns 338a are covered, and then a portion of the inner dielectric layer 122 is removed until the top of the second sacrificial patterns 338a is exposed, wherein a method of removing the portion of the inner dielectric layer 122 is, for example, chemical-mechanical polishing (CMP).

Then, referring to FIG. 3T, the second sacrificial patterns 338a are removed, and a plurality of smaller trenches 340 are formed in the inner dielectric layer 122, and a portion of the hard mask layer 124 is exposed.

Next, referring to FIG. 3U, the exposed hard mask layer 124 is removed, so that slightly larger trenches 340a are formed in the inner dielectric layer 122 and the surface of the floating gates 104 is exposed. Since part (2) is compared to section line II-II of FIG. 1, only one trench 340a is shown here.

Then, referring to FIG. 3V, the ONO layer 110 is conformally deposited on the surface of the floating gates 104, the inner surface of the trenches 340a, and the surface of the inner dielectric layer 122.

Next, referring to FIG. 3W, the unit region 300 is covered by a second protective layer 342, and the ONO layer 110 above the first sacrificial pattern 312a of the peripheral circuit region 302 is exposed, wherein the second protective layer 342 is, for example, a photoresist. Subsequently, the ONO layer 110 and the oxide layer 126 on the first sacrificial pattern 312a are removed by etching, and the surface of the first sacrificial patterns 312a is exposed.

Next, referring to FIG. 3X, the second protective layer 342 in FIG. 3W is removed and a conductive material is filled in the trenches 340a, and then the conductive material is planarized to form the plurality of control gates 108 in the trenches 340a, wherein the conductive material may be metal or polysilicon. At this step, self-aligned floating gates 104 and control gates 108 are completed. Since the formation of the floating gates 104 and the control gates 108 does not require the use of high-density plasma (HDP) reactive-ion etching (R.I.E.), the quality thereof and device reliability may be improved. In addition, the control gates 108 may directly form metal gates to control the floating gates 104 to facilitate forming a low-power consumption device. The control gate 108 of the peripheral circuit region 302 is in direct contact with the first sacrificial pattern 312a, and the ONO layer 110 of the peripheral circuit region 302 is located on two sidewalls of the control gate 108 of the peripheral circuit region 302.

Next, in order to form a contact, please refer to FIG. 3Y and FIG. 3Z. In FIG. 3Y, an inner dielectric layer 344 is deposited on the substrate 102 and the control gates 108 are covered. In FIG. 3Z, a portion of the inner dielectric layer 344, a portion of the ONO layer 110, a portion of the inner dielectric layer 122, a portion of the hard mask layer 124, a portion of the inner dielectric layer 120, and a portion of the pad oxide layer 116 are removed via etching to form contact holes 346 between the floating gates 104. In addition, due to the relationship of the etch selectivity, a groove 348 may further be formed on the top of the control gate 108 of the peripheral circuit region 302 during the process of forming the contact holes 346.

If the first protective layer 332 is omitted in the step of FIG. 3M, the first sacrificial pattern 312a in the peripheral circuit region 302 and the pad oxide layer 116 underneath would be removed together in the step of FIG. 3N and replaced with the floating gates 104 together in FIG. 3P. Therefore, after performing the same steps as FIGS. 3A-3Z without the protective layer 332, the resulting semiconductor device is as shown in FIG. 4, wherein the control gate 108 of the peripheral circuit region 302 is located on the floating gate 104 and in direct contact with the floating gate 104.

Based on the above, in the invention, reactive-ion etching (R.I.E.) is not used at all during the formation of the floating gates and the control gates, and therefore damage to the gates from high-density plasma may be prevented, such as charge trap in the floating gates may be significantly reduced to improve the reliability of data storage. In addition, since the control gates of the invention are formed by using deposition and planarization, metal may be directly used as the control gates to control the floating gates to facilitate the formation of a low-power consumption device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a semiconductor device, comprising:
    depositing a pad oxide layer on a substrate;
    forming a first sacrificial material on the pad oxide layer;
    etching to remove a portion of the first sacrificial material to form a plurality of first sacrificial patterns at a portion in which a plurality of floating gates are to be formed;
    depositing a first inner dielectric layer on the substrate and covering the plurality of first sacrificial patterns;
    removing a portion of the first inner dielectric layer until a top of the plurality of first sacrificial patterns is exposed;
    removing the plurality of first sacrificial patterns and the pad oxide layer to form a plurality of openings exposing the substrate at a portion in which the plurality of floating gates are to be formed;
    forming a tunneling dielectric layer on a surface of the substrate exposed in the plurality of openings;
    filling a polysilicon in the plurality of openings;
    planarizing the polysilicon to form the plurality of floating gates on the tunneling dielectric layer;
    forming a hard mask layer on the first inner dielectric layer and the plurality of floating gates;
    forming a second sacrificial material on the hard mask layer;
    etching to remove a portion of the second sacrificial material to form a plurality of second sacrificial patterns at a portion in which a plurality of control gates are to be formed;
    depositing a second inner dielectric layer on the substrate and covering the plurality of second sacrificial patterns;
    removing a portion of the second inner dielectric layer until a top of the plurality of second sacrificial patterns is exposed;
    removing the plurality of second sacrificial patterns and the hard mask layer to form a plurality of trenches in the second inner dielectric layer and expose a surface of the plurality of floating gates;
    conformally depositing an ONO layer on the surface of the plurality of floating gates, an inner surface of the plurality of trenches, and a surface of the second inner dielectric layer;
    filling a conductive material in the plurality of trenches; and
    planarizing the conductive material to form the plurality of control gates in the plurality of trenches.

2. The manufacturing method of the semiconductor device of claim 1, further comprising, before the first sacrificial material is formed:
    depositing a silicon nitride layer on the pad oxide layer;
    patterning the silicon nitride layer;
    etching the pad oxide layer and the substrate using the patterned silicon nitride layer as an etch mask to form a plurality of isolation trenches in the substrate and define a plurality of active regions;
    forming a plurality of isolation structures in the plurality of isolation trenches and exposing the patterned silicon nitride layer; and
    removing the silicon nitride layer to form a plurality of sacrificial trenches.

3. The manufacturing method of the semiconductor device of claim 2, wherein a method of forming the first sacrificial material comprises:
    filling the first sacrificial material in the plurality of sacrificial trenches and exposing the isolation structures; and
    removing a portion of the isolation structures to expose sidewalls of the first sacrificial material.

4. The manufacturing method of the semiconductor device of claim 2, wherein a method of forming the plurality of isolation structures comprises:
    filling a spin-on glass (SOG) in the plurality of isolation trenches;
    curing; and
    depositing a high-density plasma (HDP) oxide on the cured SOG.

5. The manufacturing method of the semiconductor device of claim 1, wherein the conductive material is a metal or a polysilicon.

6. The manufacturing method of the semiconductor device of claim 1, further comprising, after the plurality of first sacrificial patterns are formed:
    performing a low-doped drain (LDD) implantation to form an LDD region in the substrate;
    forming spacers on sidewalls of the plurality of first sacrificial patterns; and
    performing a source and drain (S/D) implantation to form an S/D region in the substrate.

7. The manufacturing method of the semiconductor device of claim 1, wherein the substrate comprises a peripheral circuit region, and
    forming at least one of the first sacrificial patterns in the peripheral circuit region at the same time that the plurality of first sacrificial patterns are formed;
    forming a protective layer in the peripheral circuit region to cover the first sacrificial patterns before a portion of the first inner dielectric layer is removed;
    forming at least one of the second sacrificial patterns above the first sacrificial patterns in the peripheral circuit region at the same time that the plurality of second sacrificial patterns are formed; and
    removing the ONO layer in the peripheral circuit region and exposing a surface of the first sacrificial patterns after the ONO layer is deposited.

8. The manufacturing method of the semiconductor device of claim 1, further comprising, after the plurality of control gates are formed:
    depositing a third inner dielectric layer on the substrate and covering the plurality of control gates; and
    removing a portion of the third inner dielectric layer, the ONO layer, the second inner dielectric layer, the hard mask layer, the first inner dielectric layer, and the pad oxide layer to form contact holes between the plurality of floating gates.

9. The manufacturing method of the semiconductor device of claim 1, wherein the substrate comprises a unit region and a peripheral circuit region.

10. The manufacturing method of the semiconductor device of claim 9, wherein after the step of etching to remove a portion of the first sacrificial material to form the plurality of first sacrificial patterns, at least one of the plurality of first sacrificial patterns in the peripheral circuit region is wider than the plurality of first sacrificial patterns in the unit region.

11. The manufacturing method of the semiconductor device of claim 9, wherein before the step of removing the plurality of first sacrificial patterns and the pad oxide layer, further comprising covering the peripheral circuit region via a first protective layer.

12. The manufacturing method of the semiconductor device of claim 11, wherein after the step of removing the plurality of first sacrificial patterns and the pad oxide layer, further comprising removing the first protective layer.

13. The manufacturing method of the semiconductor device of claim 11, wherein after the step of planarizing the polysilicon to form the plurality of floating gates on the tunneling dielectric layer, at least one of the first sacrificial patterns still remains in the peripheral circuit region.

14. The manufacturing method of the semiconductor device of claim 11, wherein after the step of conformally depositing an ONO layer on the surface of the plurality of floating gates, further comprising:
    covering the unit region by a second protective layer to expose the ONO layer above at least one of the first sacrificial patterns of the peripheral circuit region;
    etching the ONO layer of the peripheral circuit region until the at least one of the first sacrificial patterns of the peripheral circuit region is exposed; and
    removing the second protective layer.

15. The manufacturing method of the semiconductor device of claim 14, wherein after the step of planarizing the conductive material to form the plurality of control gates in the plurality of trenches, the control gate of the peripheral circuit region is in direct contact with the at least one of the first sacrificial patterns of the peripheral circuit region, and the ONO layer of the peripheral circuit region is located on two sidewalls of the control gate of the peripheral circuit region.

* * * * *